(12) United States Patent
Kanna et al.

(10) Patent No.: US 6,727,036 B2
(45) Date of Patent: Apr. 27, 2004

(54) POSITIVE-WORKING RADIATION-SENSITIVE COMPOSITION

(75) Inventors: Shinichi Kanna, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/748,198

(22) Filed: Dec. 27, 2000

(65) Prior Publication Data

US 2001/0033993 A1 Oct. 25, 2001

(30) Foreign Application Priority Data

Dec. 27, 1999 (JP) ......................... P. 11-370355

(51) Int. Cl.$^7$ ............... G03C 1/73; G03F 7/039
(52) U.S. Cl. ............ 430/270.1; 430/326; 430/905; 430/914
(58) Field of Search ............ 430/287.1, 270.1, 430/285.1, 326, 905, 914

(56) References Cited

U.S. PATENT DOCUMENTS

| | | | | |
|---|---|---|---|---|
| 5,403,695 | A | | 4/1995 | Hayase et al. ............... 430/192 |
| 5,670,299 | A | * | 9/1997 | Urano et al. ................. 430/326 |
| 5,994,025 | A | * | 11/1999 | Iwasa et al. ............. 430/270.1 |
| 6,004,721 | A | * | 12/1999 | Tan et al. ................. 430/270.1 |
| 6,136,500 | A | * | 10/2000 | Kobayashi et al. ....... 430/270.1 |
| 6,265,135 | B1 | * | 7/2001 | Kodama et al. ......... 430/286.1 |
| 6,270,941 | B1 | * | 8/2001 | Yasunami ................ 430/270.1 |

FOREIGN PATENT DOCUMENTS

| | | |
|---|---|---|
| JP | A-2-19847 | 1/1990 |
| JP | A-4-219757 | 8/1992 |
| JP | A-5-249682 | 9/1993 |
| JP | A-5-323590 | 12/1993 |
| JP | A-8-123032 | 5/1996 |
| JP | A-8-253534 | 10/1996 |
| JP | A-11-125907 | 5/1999 |
| JP | 11-282163 | * 10/1999 |

OTHER PUBLICATIONS

English translation for JP 11–282163 (Toshiaki et al.), Oct. 1999.*

English abstract for JP 11–282163 provided by Derwent data base, 1999.*

* cited by examiner

*Primary Examiner*—Mark F. Hoff
*Assistant Examiner*—Sin J. Lee
(74) *Attorney, Agent, or Firm*—Sughrue Mion, PLLC

(57) ABSTRACT

A positive-working radiation-sensitive composition containing a resin having an acid-decomposing group having a specific acetal structure, and being decomposed by the action of an acid to increase the solubility thereof in an alkali developer; a compound generating an acid by the irradiation of an active light or radiation and contributes to the decomposition reaction of the acid-decomposing group of the resin; a compound generating an acid by the irradiation of an active light or radiation but does not contribute to the decomposition reaction of the acid-decomposing group of the resin; a surface active agent, and a solvent.

19 Claims, No Drawings

POSITIVE-WORKING RADIATION-SENSITIVE COMPOSITION

FIELD OF THE INVENTION

The present invention relates to a positive-working radiation-sensitive composition used for lithographic printing plates, production processes of semiconductors such as IC, etc., productions of circuit substrates such as liquid crystal, thermal head, etc., and further other photofabrication processes.

BACKGROUND OF THE INVENTION

As a resist used for a pattern formation of lithographs using a far-ultraviolet light or an excimer laser light, there are chemical amplification type resist compositions described in U.S. Pat. No. 4,491,628, European Patent 29139, etc. The chemical amplification type positive-working resist composition is a pattern-forming material of forming an acid at the light-exposed portions by the irradiation of a radiation such as a far-ultraviolet light, etc., changing the solubility of the irradiated portions by the active radiation and non-irradiated portions in a developer by the reaction using the acid as a catalyst, and forming a pattern on a substrate.

The above-described chemical amplification type positive-working resist composition is largely classified into a three-component system comprising an alkali-soluble resin, a compound generating an acid by the exposure of a radiation (the compound is referred to as photo-acid generator), and a dissolution-inhibiting compound having an acid-decomposing group to the alkali-soluble resin; a two-component system comprising a resin having a group which becomes alkali-soluble by decomposing by the reaction with an acid and the photo-acid generator; and a hybrid system comprising a resin having a group which becomes alkali-soluble by decomposing by the reaction with an acid, a low-molecular weight dissolution-inhibiting compound having an acid decomposing group, and the photo-acid generator.

JP-A-2-19847 (the term "JP-A" as used herein means an unexamined published Japanese Patent application) discloses a resist composition containing a resin wherein the phenolic hydroxy group of a poly(p-hydroxystyrene) is wholly or partially protected by a tetrahydropyranyl group.

JP-A-4-219757 similarly discloses a resist composition containing a resin wherein from 20 to 70% of the phenolic hydroxy group of poly(p-hydroxystyrene) is replaced with an acetal group.

Furthermore, JP-A-5-249682 similarly discloses a photoresist composition using a resin protected with an acetal group. Also, JP-A-8-123032 discloses a photoresist composition using a terpolymer containing a group substituted by an acetal group.

Furthermore, JP-A-8-253534 discloses a photoresist composition using a partially crosslinked polymer containing a group substituted by an acetal group.

Also, in JP-A-5-323590, it is described to use two kinds of photo-acid generators, in U.S. Pat. No. 5,403,695, it is described to use a photo-acid generator generating a strong acid and a photo-acid generator generating a weak acid, and in JP-A-11-125907, it is described to use a compound generating a carboxylic acid having a boiling point of at least 150° C. and a compound generating an acid other than a carboxylic acid.

However, in the above-described techniques, there was a room to be improved in the pitch dependency (iso/dense bias). Because as the tendency of recent devices, various patterns are contained, various performances have been demanded for resists. One of them is the pitch dependency. In a device, there exist a portion of closed lines, a pattern having a wide space compared with lines, and further an isolated line. Accordingly, it is important to resolve various lines with a high reproducibility. However, in the present state, it is not always easy by an optical factor to reproduce various lines and a resolution method by a resist is not clear.

Furthermore, in the exposure margin, the requirement of further improving has also been strong. In this case, the exposure margin is a phenomenon that when the exposure amount is changed, the line width of the pattern obtained according to the change is changed.

SUMMARY OF THE INVENTION

Accordingly, an object of the present invention is to provide a positive-working radiation-sensitive composition excellent in the pitch dependency.

A further object of the invention is to provide a positive-working radiation-sensitive composition excellent in the exposure margin.

The above-described objects of the invention are attained by the following constructions.

That is, the 1st aspect of the invention is a positive-working radiation-sensitive composition comprising (a) a resin having an acid-decomposing group represented by the following formula (I), which is decomposed by the action of an acid to increase the solubility in an alkali developer, (b-1) at least one kind of compounds each generates an acid by the irradiation of an active light or radiation and contributes to the decomposition reaction of the above-described acid-decomposing group, (b-2) at least one kind of compounds each generates an acid by the irradiation of an active light or radiation but does not contribute to the decomposition reaction of the above-described acid-decomposing group, (c) a surface active agent, and (d) a solvent;

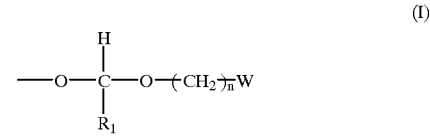

wherein, $R_1$ represents an alkyl group having from 1 to 4 carbon atoms; W represents an organic group containing at least one kind of atoms selected from the group consisting of an oxygen atom, a nitrogen atom, a sulfur atom, a phosphorus atom, and a silicon atom, and at least one carbon atom, an amino group, an ammonium group, a mercapto group, a substituted or unsubstituted aryl group, or a substituted or unsubstituted cyclic alkyl group; and n represents an integer of from 1 to 4.

A second aspect of the invention is the positive-working radiation-sensitive composition of the first aspect, wherein the above-described resin (a) is a resin in which at least a part of a phenolic hydroxy group of an alkali-soluble resin having the phenolic hydroxy group is protected by the acid-decomposing group shown by the above-described formula (I).

A third aspect of the invention is the positive-working radiation-sensitive composition of the first aspect, wherein W of the above-described formula (I) is at least one kind of a substituent selected from the group of the substituents shown below;

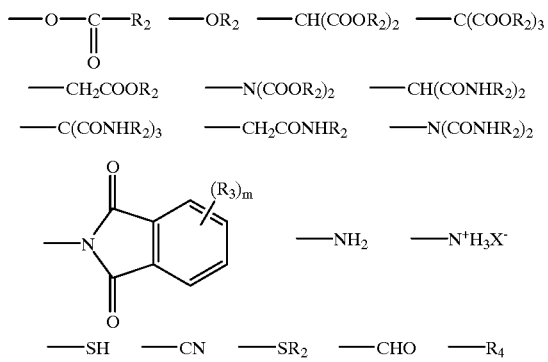

wherein, $R_2$ represents a straight chain, branched or cyclic alkyl group having from 1 to 6 carbon atoms, a straight chain, branched, or cyclic alkenyl group having from 2 to 6 carbon atoms, a substituted or unsubstituted aryl group, or a substituted or unsubstituted aralkyl group; $R_3$ represents a hydrogen atom, a straight chain, branched or cyclic alkyl group having from 1 to 6 carbon atoms, a straight chain, branched or cyclic alkoxy group having from 1 to 6 carbon atoms, a halogen atom, a nitro group, an amino group, a hydroxy group, or a cyano group; X represents a halogen atom; $R_4$ represents a substituted or unsubstituted aryl group or a substituted or unsubstituted cyclic alkyl group having from 3 to 15 carbon atoms; and m represents a natural number of from 1 to 4.

A fourth aspect of the invention is the positive-working radiation-sensitive composition of the first aspect, wherein the compound (b-1) is a compound generating a sulfonic acid by the irradiation of an active light or radiation and the compound (b-2) is a compound generating a carboxylic acid by the irradiation of an active light or radiation.

A fifth aspect of the invention is the positive-working radiation-sensitive composition of any one of the first to fourth aspects, wherein the composition further contains an organic basic compound.

In the positive-working radiation-sensitive composition of the invention, by using the acid-decomposing resin having an acetal group having at the terminal a substituent of a specific structure as an acid-decomposing group together with a combination of a compound contributing to the decomposition of the above-described specific acid-decomposing group with a compound of not contributing to the decomposition as a compound generating an acid by the irradiation of an active light or radiation, the pitch dependency is greatly improved and the exposure margin (exposure latitude) becomes excellent.

DETAILED DESCRIPTION OF THE INVENTION

Then, the components such as the compounds, resins, etc., contained in the positive-working radiation-sensitive composition of the invention are described in detail.

[I] Acid-decomposing Resin of the Component (a)

In the present invention, the acid-decomposing resin is a resin having the structure wherein the alkali-soluble group is protected by the acid-decomposing group (protective group) shown by the above-described formula (I). In this case, the alkali-soluble group includes a phenolic hydroxy group, a carboxyl group, a sulfonic acid group, etc. In these groups, the phenolic hydroxy group is preferred. As the acid-decomposing resin in the invention, an alkali-soluble resin having a phenolic hydroxy group wherein the phenolic hydroxy group is protected by the group shown by the above-described formula (I) is preferred.

As the alkali-soluble resin having the phenolic hydroxy group used in the invention, a copolymer containing at least 30 mol %, and preferably at least 50 mol % o-, m-, or p-hydroxystyrene or o-, m-, or p-hydroxy-α-methylstyrene, or the homopolymer, or the partially hydrogenated resin is preferred, and the p-hydroxystyrene homopolymer is more preferred. The monomers of the above-described copolymers preferably include acrylic acid esters, methacrylic acid esters, acrylamides, methacrylamides, acrylonitrile, methacrylonitrile, maleic anhydride, styrene, α-methylstyrene, acetoxystyrene, and alkoxystyrenes, and more preferably include styrene, acetoxystyrene, and tert-butoxystyrene.

The range of the weight average molecular weight of the alkali-soluble resin is, as a polystyrene converted value measured by a GPC method, preferably from 3000 to 80,000, and more preferably from 7000 to 50,000. That range of the molecular weight distribution (Mw/Mn) is from 1.01 to 4.0, and preferably from 1.05 to 1.20. To obtained the polymer of the molecular weight distribution, the use of a method of an anionic polymerization, etc., is preferred.

In the formula (I) described above;
n is a natural number of from 1 to 4, and preferably 2 or 3.
$R_1$ is preferably methyl, ethyl, n-propyl, isopropyl, n-butyl, isobutyl, sec-butyl, and tert-butyl, and in these groups, methyl is more preferable.

Also, the organic group shown by W is constituted of at least one carbon atom and at least one kind of atom selected from an oxygen atom, a nitrogen atom a sulfur atom, a phosphorus atom, and a silicon atom.

More practically, the preferred groups of W are shown below.

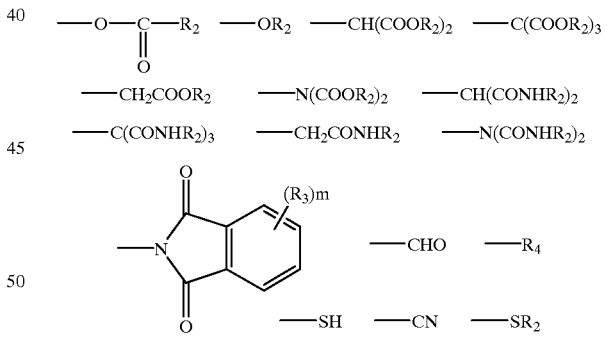

In the above formulae;
$R_2$ represents a group selected from the group consisting of a straight chain, branched, or cyclic alkyl group having from 1 to 6 carbon atoms, a straight chain, branched, or cyclic alkenyl group, a substituted or unsubstituted aryl group, and a substituted or unsubstituted aralkyl group.
$R_3$ represents a group selected from the group consisting of a hydrogen atom, a straight chain, branched, or cyclic alkyl group having from 1 to 6 carbon atoms, a straight chain, branched, or cyclic alkoxy group having from 1 to 6 carbon atoms, a halogen atom, a nitro group, an amino group, a hydroxy group, and a cyano group.

X represents a halogen atom.

R₄ represents a substituted or unsubstituted aryl group or a substituted or unsubstituted cyclic alkyl having from 3 to 15 carbon atoms.

Also, m represents a natural number of from 1 to 4, and is preferably 1 or 2.

In R₂ and R₃ described above, as the straight chain, branched, or cyclic alkyl group having from 1 to 6 carbon atoms, methyl, ethyl, n-propyl, isopropyl, cyclopropyl, n-butyl, isobutyl, sec-butyl, tert-butyl, pentyl, isopentyl, neopentyl, cyclopentyl, hexyl, cyclohexyl, etc., are preferred, and methyl and ethyl are more preferred.

As the straight chain, branched, or cyclic alkenyl group having from 2 to 6 carbon atoms shown by R₂, vinyl, 1-propenyl, allyl, isopropenyl, 1-butenyl, 2-butenyl, 2-pentenyl, cyclohexenyl, etc., are preferred, and vinyl and isopropenyl are more preferred.

As the aryl group in R₂ and R₄, phenyl, tolyl, xylyl, mesityl, cumenyl, etc., are preferred and phenyl is more preferred. As the aralkyl group in R₂, benzyl, phenethyl, α-methylbenzyl, benzhydryl, etc., are preferred, and benzyl is more preferred. As the cyclic alkyl group having from 3 to 15 carbon atoms in R₄, a cyclobutyl group, a cyclopentyl group, a cyclohexyl group, etc., are preferred.

Each of these aryl group, aralkyl group, and cyclic alkyl group may be substituted by a halogen atom, a nitro group, an alkoxy group, an acetyl group, an amino group, an ester group, an amide group, etc.

As the straight chain, branched, or cyclic alkoxy group in R₃, methoxy, ethoxy, propoxy, isopropoxy, butoxy, pentyloxy, hexyloxy, etc., are preferred and methoxy and ethoxy are more preferred.

As the halogen atom, fluorine, chlorine, bromine and iodine are preferred and chlorine and bromine are more preferred.

Also, W may be a cyano group or a formyl group as described above.

Then, more practical examples of the protective group represented by the formula (I) described above are shown below but the invention is not limited to them. In the following formulae, Me represents a methyl group, Et an ethyl group, and Ph a phenyl group.

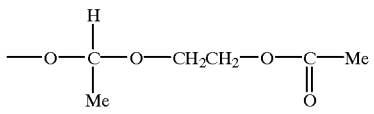

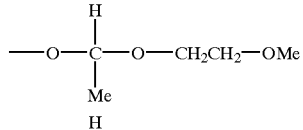

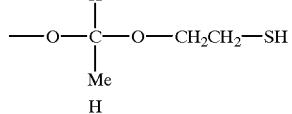

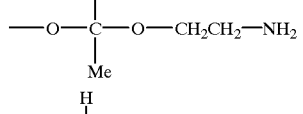

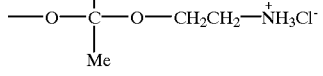

-continued

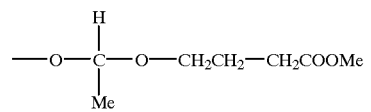

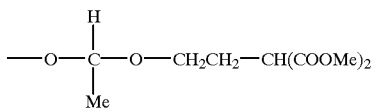

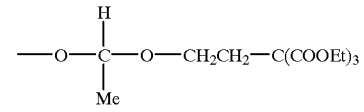

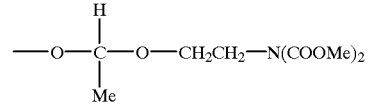

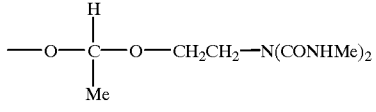

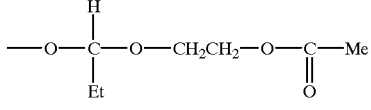

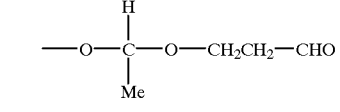

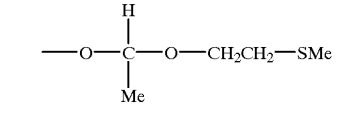

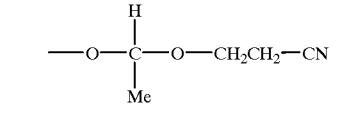

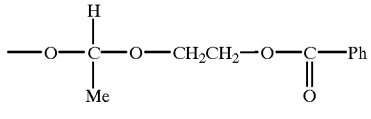

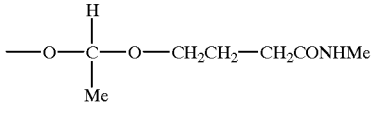

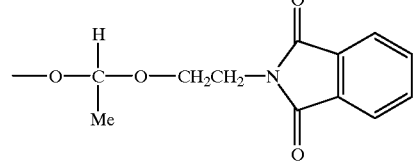

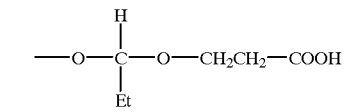

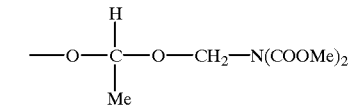

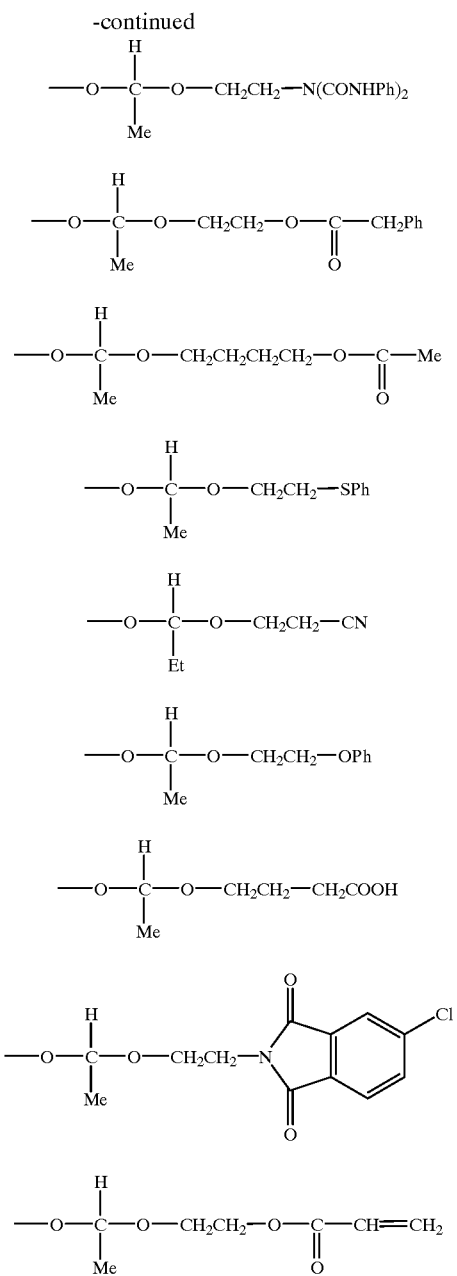
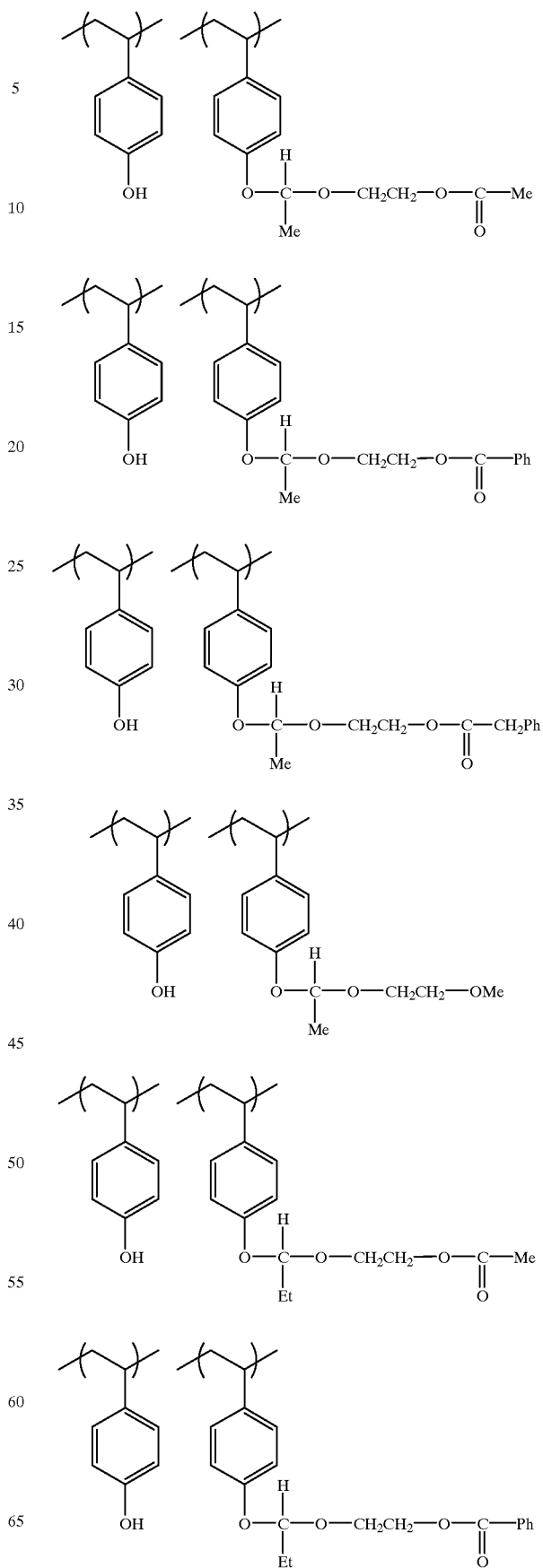

The resin, wherein the phenolic hydroxy group is protected by the above-described protective group, constituting the resin (a) can be obtained by synthesizing the corresponding vinyl ether and reacting with an alkali-soluble resin having a phenolic hydroxy group dissolved in a proper solvent such as tetrahydrofuran, etc., by a known method. The reaction is practiced in the presence of an ordinary acidic catalyst, preferably an acidic ion-exchange resin, hydrochloric acid, p-toluenesulfonic acid, or a salt such as pyridinium tosylate. The corresponding vinyl ether can be synthesized from an active raw material such as chloroethyl vinyl ether by a method such as a nucleophilic substitution reaction, etc.

Specific examples of the structure of the resin constituting the resin (a) are illustrated below but the invention is not limited to them. In addition, in the following formulae, Me represents a methyl group, Et an ethyl group, Ph a phenyl group, t-Bu a tert-butyl group, and Ac an acetyl group.

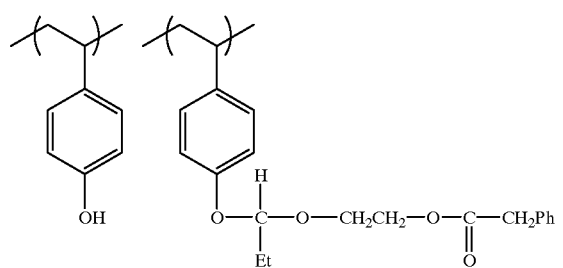
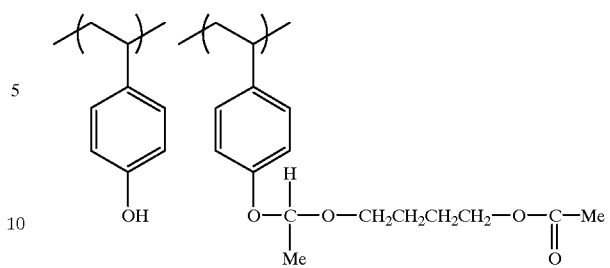
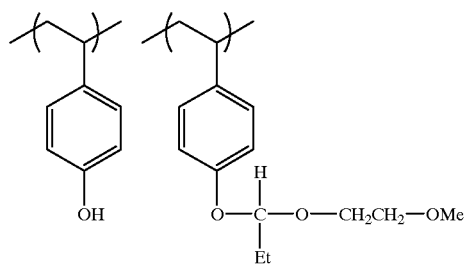
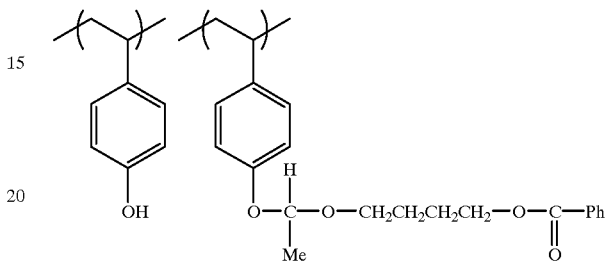
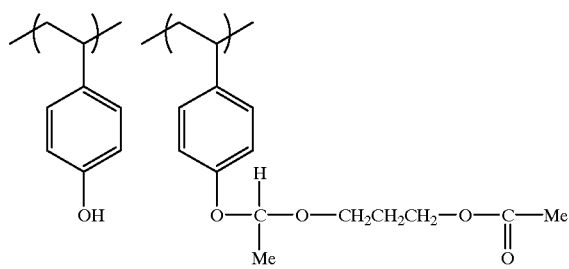
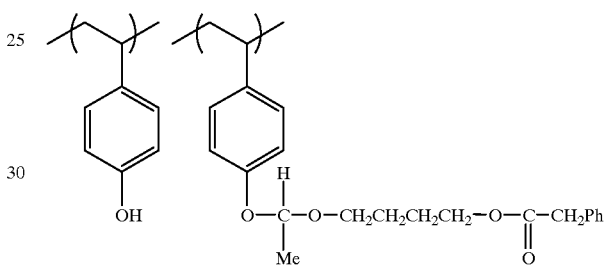
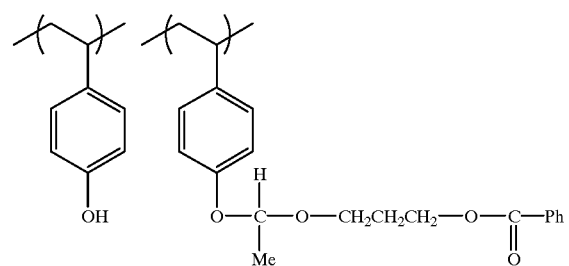
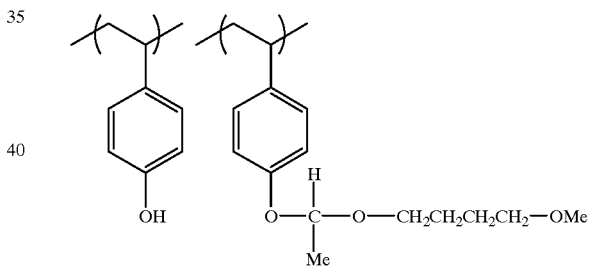
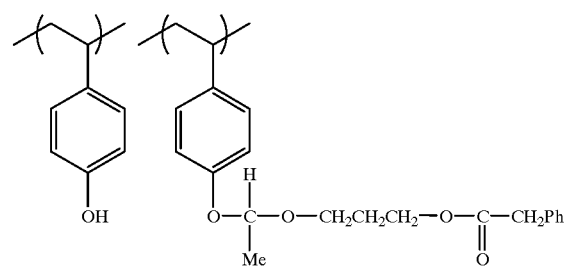
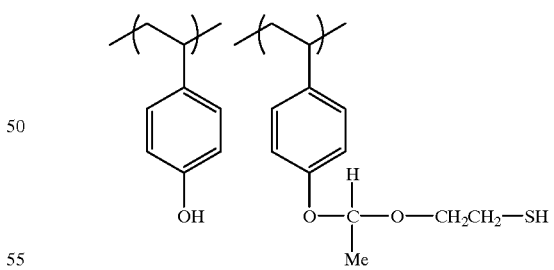
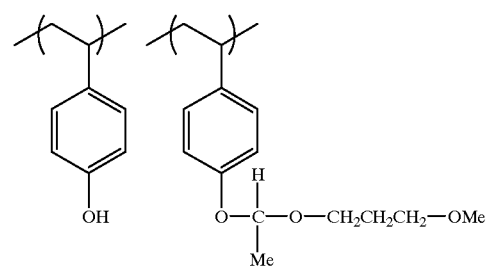
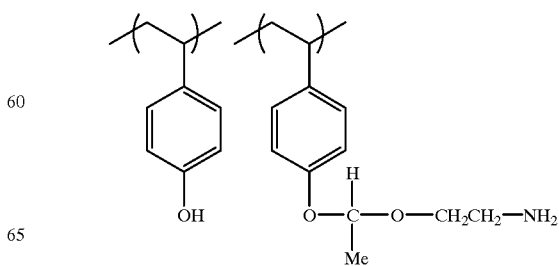

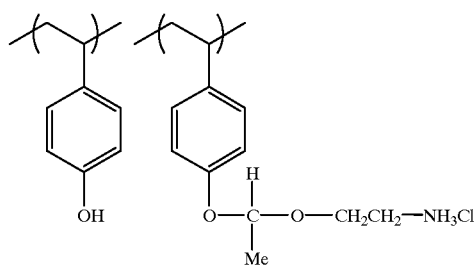
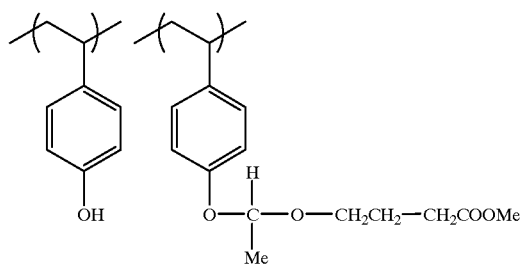
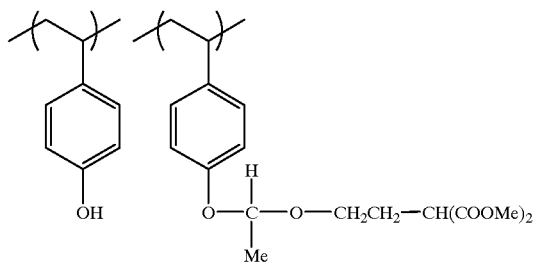
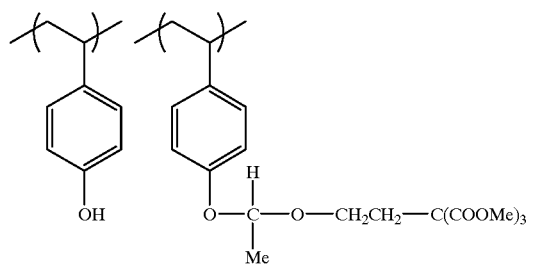
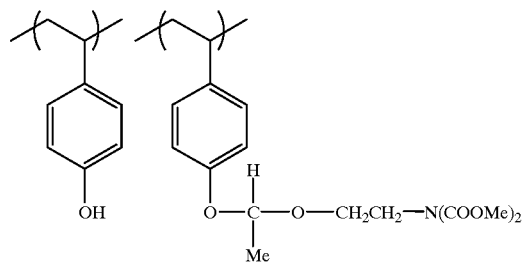
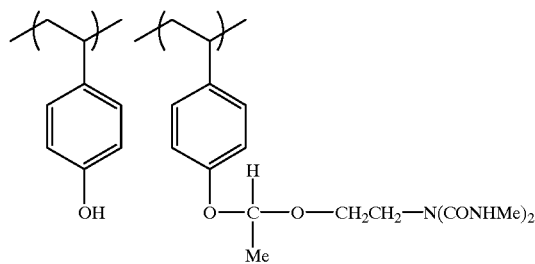
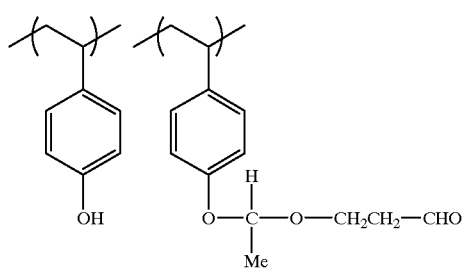
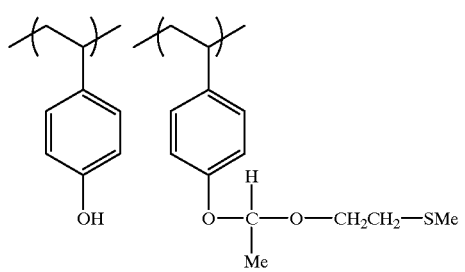
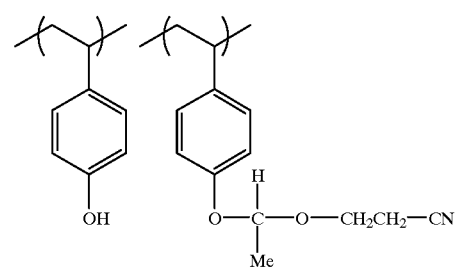
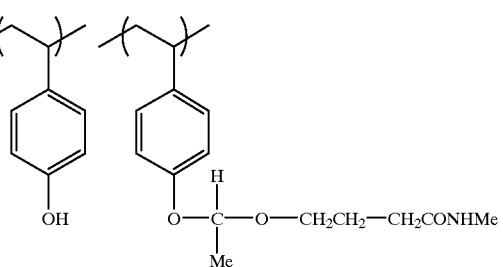
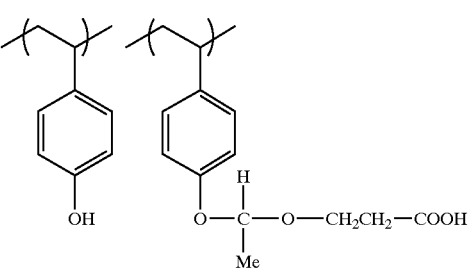
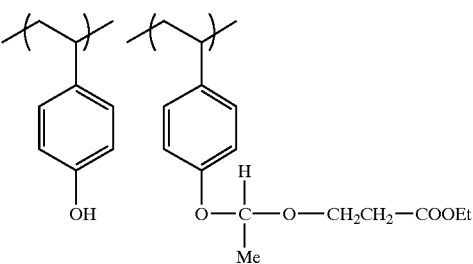

-continued
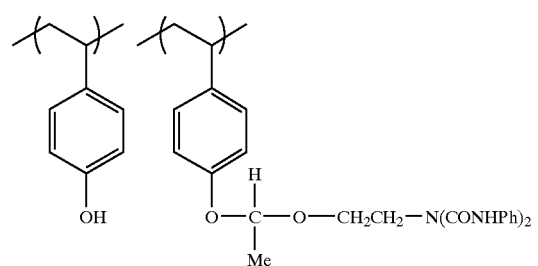
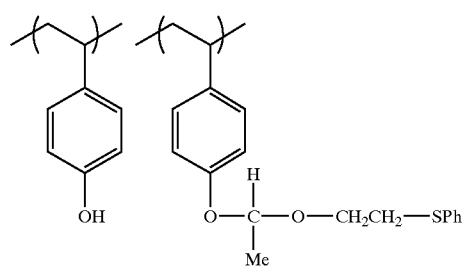
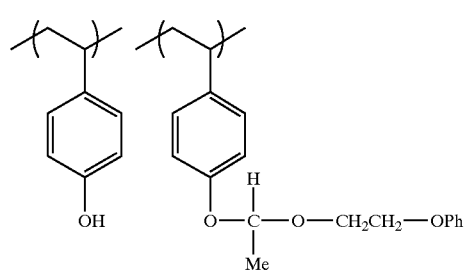
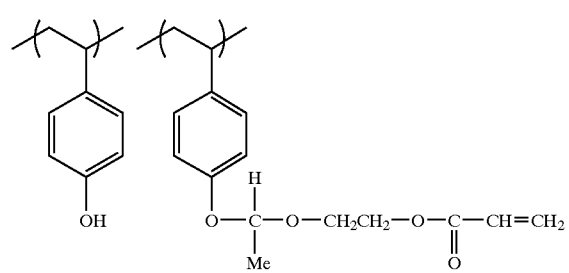
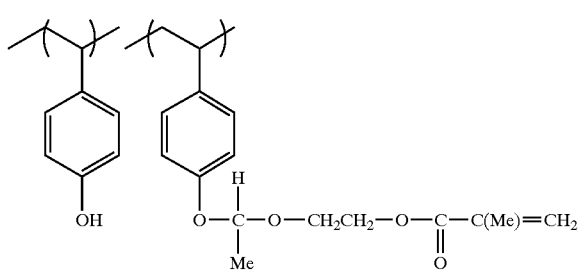
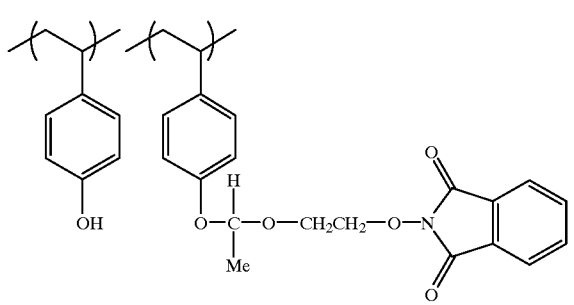
-continued
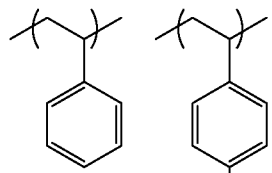
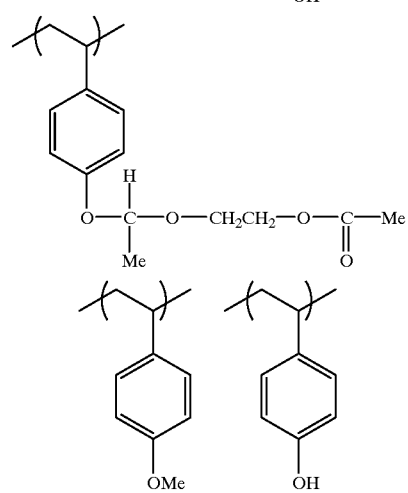
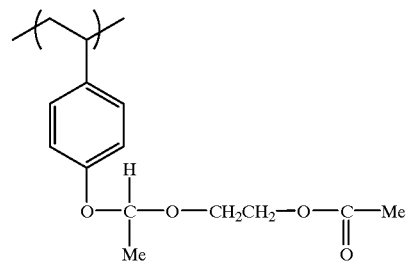
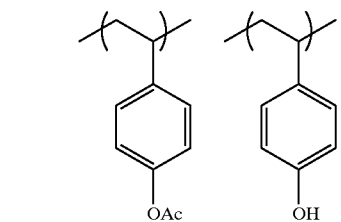
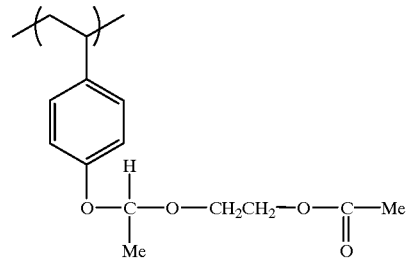
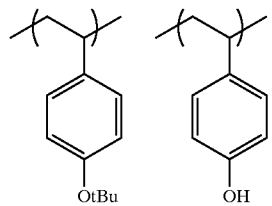

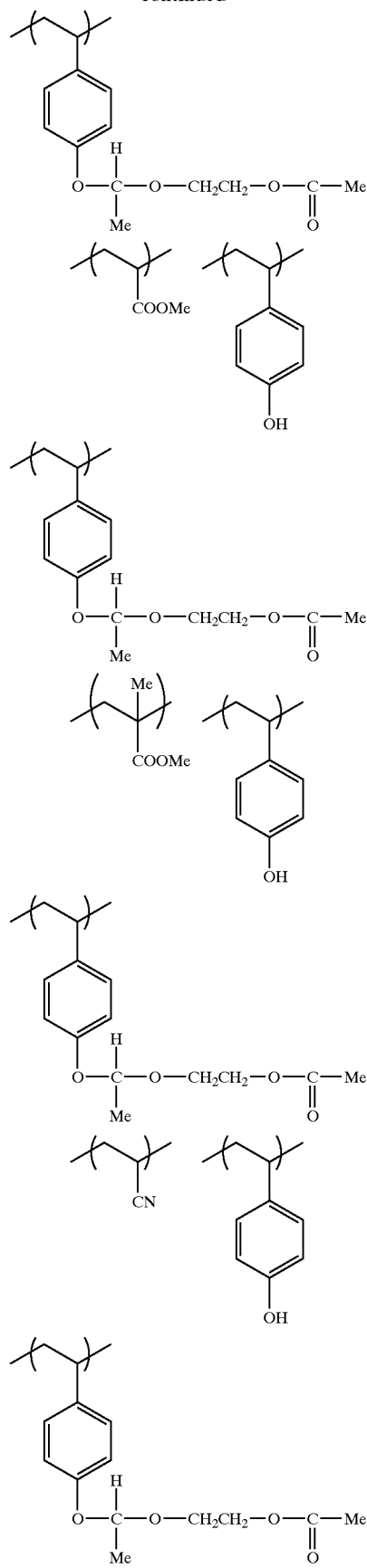

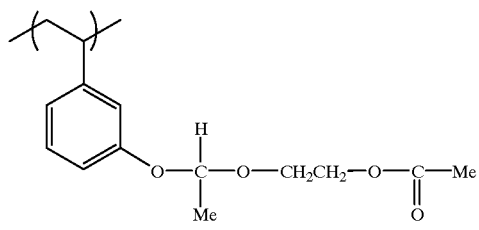
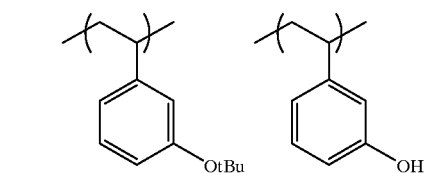
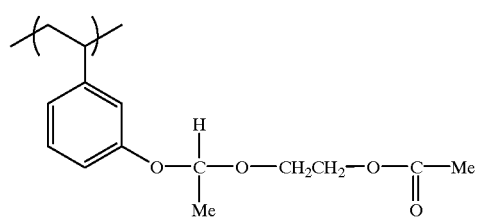
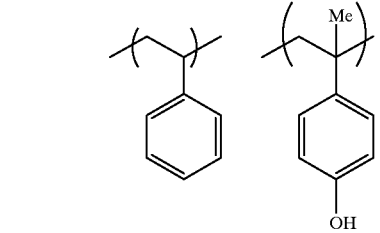
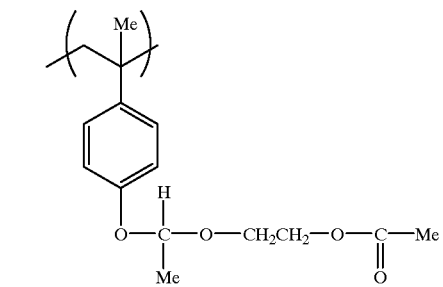
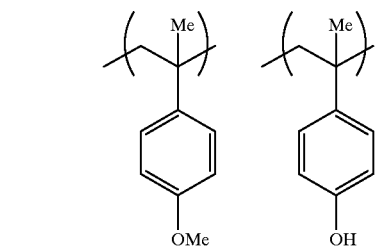
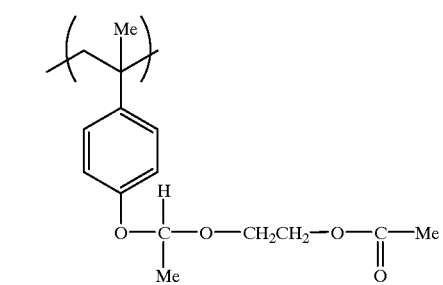
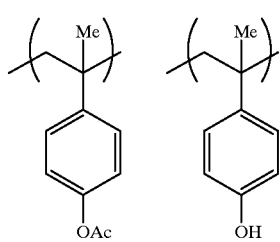
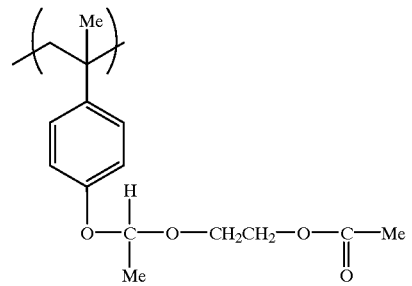
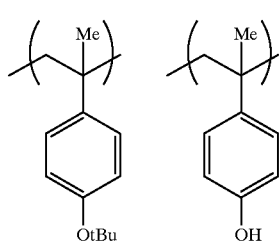
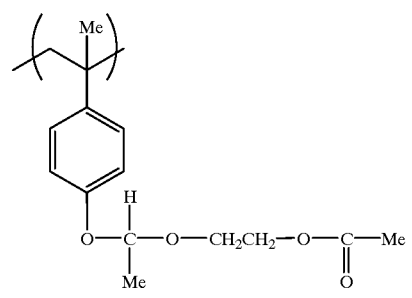
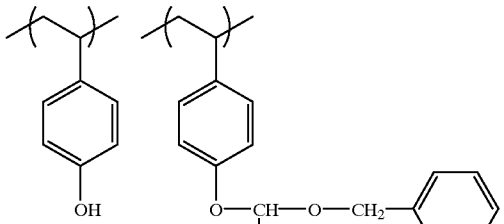
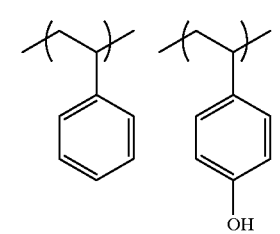

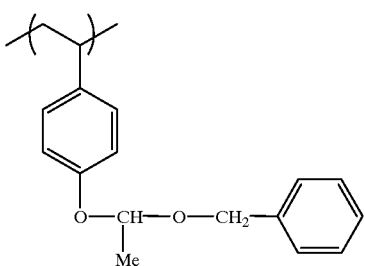
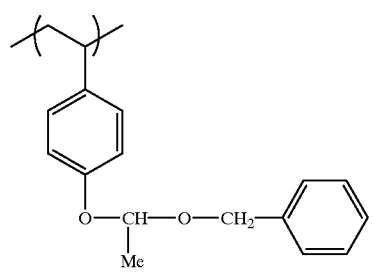
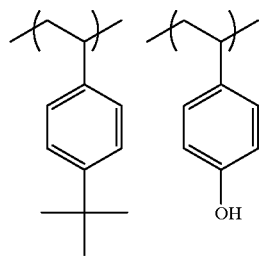
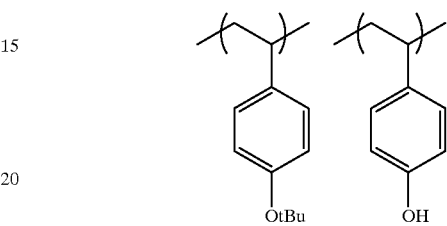
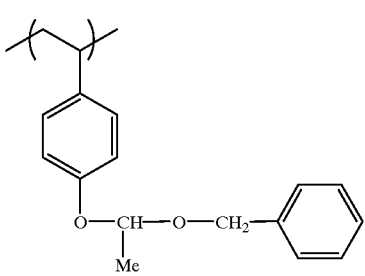
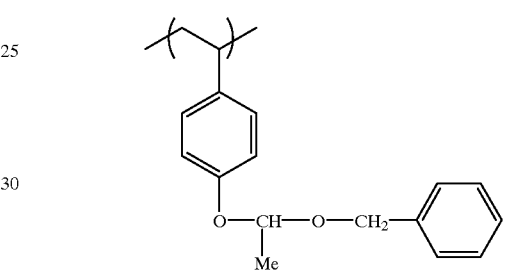
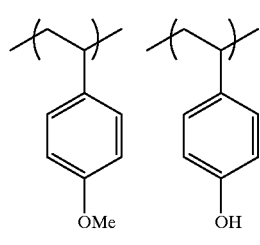
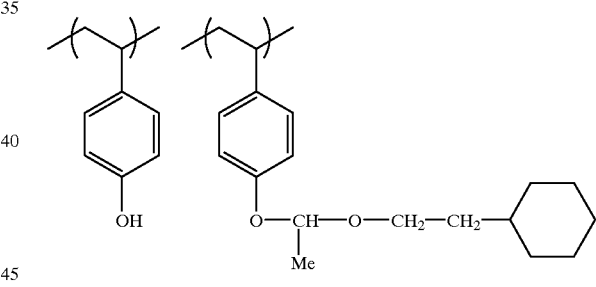
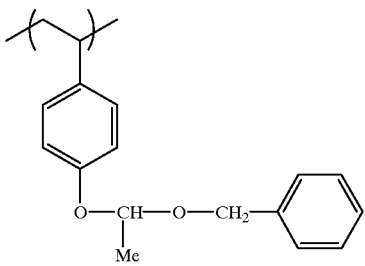
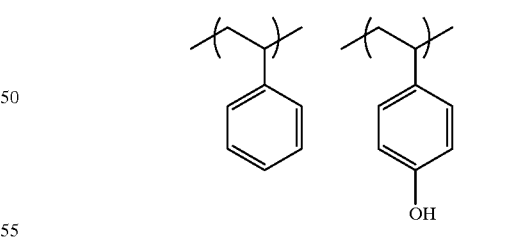
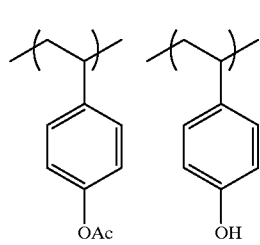
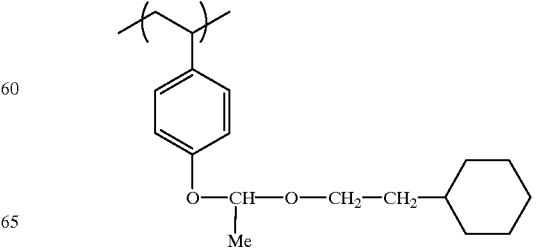

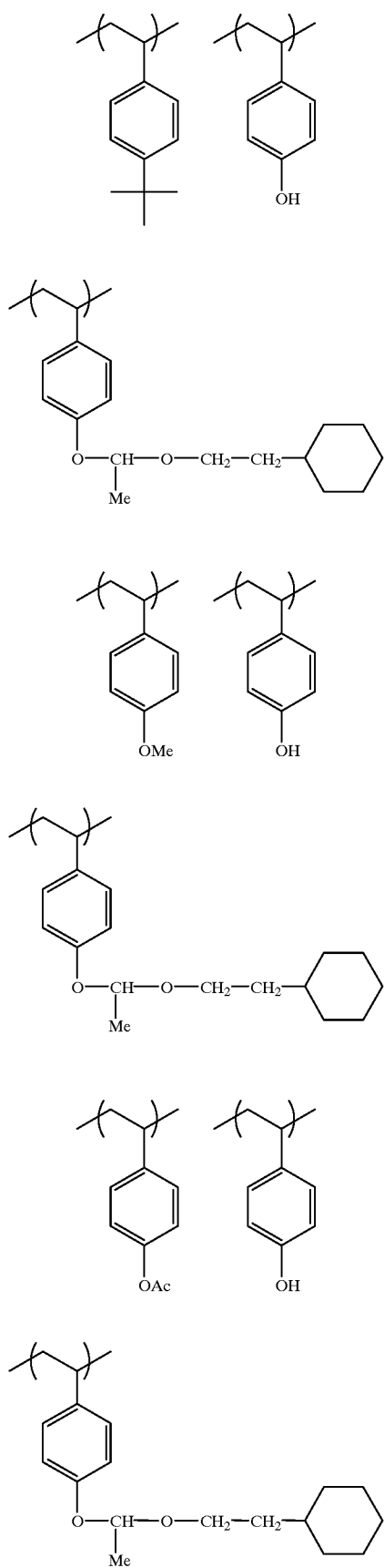
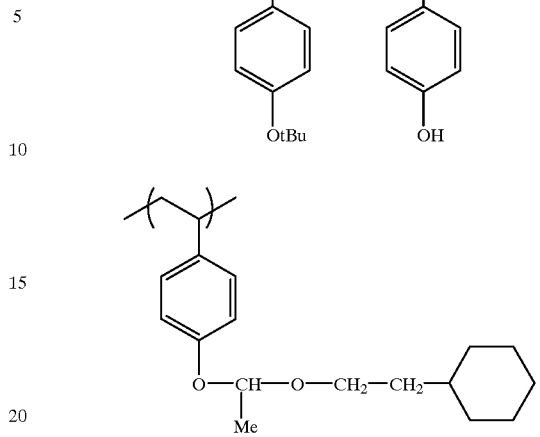

The composition of the present invention contains the above-described resin wherein the phenolic hydroxy group is protected by the protected group shown by the formula (I) described above. The protection ratio by the protective group shown by the formula (I) is preferably from 5 to 45 mol %, and more preferably from 10 to 30 mol % to the total phenolic hydroxy groups in the resin.

In the composition of the invention, the total using amount of the acid-decomposing resin (a) is preferably from 10 to 99.9% by weight, more preferably from 50 to 99.5% by weight, and still more preferably from 70 to 99.0% by weight based on the total weight (excluding a solvent) of the composition.

The composition of the invention can contain an alkali-soluble resin without containing the acid-decomposing group such as, for example, the protective group shown by the formula (I), whereby the sensitivity is increased. The alkali-soluble resin without containing an acid-decomposing group (hereinafter, is referred simply as "alkali-soluble resin") preferably includes a novolac resin; derivatives of a novolac resin; copolymers containing a p-hydroxystyrene unit, such as poly(p-hydroxystyrene), a p/m-hydroxystyrene copolymer, a p/o-hydroxystyrene copolymer, a p-hydroxystyrene-styrene copolymer etc.; alkyl-substituted hydroxystyrene resins such as a 4-hydroxy-3-methylstyrene resin, a 4-hydroxy-3,5-dimethylstyrene resin, etc; the alkylated products or acetylated product of the OH portions of these resins.

Furthermore, the above-described resins wherein a part (not more than 30 mol % of the whole phenol nuclei) of the phenol nucleus is hydrogenated is preferred in the points of giving an improved transparency to the resin, the sensitivity, the resolution, and forming a good profile. As such resins, there are a partially hydrogenated novolac resin, partially hydrogenated polyhydroxystyrene, etc.

Other alkali-soluble resin which can be incorporated in the composition of the invention includes an acetone-pyrogallol resin, a hydroxystyrene-N-substituted maleimide copolymer, a partially O-alkylated or O-acylated product of polyhydroxystyrene, a styrene-maleic anhydride copolymer, a carboxyl group-containing methacrylic resin and the derivatives thereof, a styrene-polyhydroxystyrene copolymer, etc., although the invention is not limited to them.

The particularly preferred alkali-soluble resins used in the invention include a novolac resin; an alkali-soluble resin containing a p-hydroxystyrene unit [preferably, poly(p-hydroxystyrene), a p/m-hydroxystyrene copolymer, a p/o-hydroxystyrene copolymer, and a p-hydroxystyrene-styrene copolymer]; an alkyl-substituted hydroxystyrene resin such as a 4-hydroxy-3-methylstyrene resin, 4-hydroxy-3,5-dimethylstyrene resin, etc.; the alkylated or acetylated products of the OH portions of the above-described resins; a polyhydroxystyrene resin; a partially hydrogenated novolac resin, and a partially hydrogenated polyhydroxystyrene resin.

In the invention, polyhydroxystyrene is a polymer obtained by polymerizing at least one kind of a monomer selected from a p-hydroxystyrene monomer, a m-hydroxystyrene monomer, an o-hydroxystyrene monomer, and the hydroxystyrene monomers obtained by substituting an alkyl group having from 1 to 4 carbon atoms for the o-position of each of the above-described monomers.

The above-described novolac resin is obtained by addition-condensing a definite monomer as the main constituent with an aldehyde in the presence of an acidic catalyst.

As the definite monomer described above, cresols such as phenol, m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphenol, p-tert-butylphenol, p-octylphenol, 2,3,5-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; bisalkylphenols such as 2-methyl-4-isopropylphenol, etc.; and hydroxy aromatic compounds such as dihydroxybiphenyl, bisphenol A, phenylphenol, resorcinol, naphthol, etc., can be used singly or as a mixture of two or more kinds thereof, although the invention is not limited to these compounds.

As the aldehydes, for example, formaldehyde, para-formaldehyde, acetaldehyde, propylaldehyde, benzaldehyde, phenylacetaldehyde, α-phenylpropyl-aldehyde, β-phenylpropylaldehyde, o-hydroxybenzaldehyde, m-hydroxybenzaldehyde, p-hydroxybenzaldehyde, o-nitrobenzaldehyde, m-nitrobenzaldehyde, p-nitrobenzaldehyde, o-nitrobenzaldehyde, m-methylbenzaldehyde, p-methylbenzaldehyde, p-ethylbeznaldehyde, p-n-butylbenzaldehyde, furfural, and the acetal products of them can be used, but in these aldehydes, the use of formaldehyde is preferred.

These aldehydes are used singly or as a combination of two or more kinds thereof.

Also, the acidic catalyst, sulfuric acid, formic acid, acetic acid, oxalic acid, etc., can be used.

The content of the alkali-soluble resin without having an acid-decomposing group is not more than 50% by weight, preferably not more than 30% by weight, and more preferably not more than 20% by weight to the sum total of the alkali-soluble resin and the acid-decomposing group-containing resin.

(b) Photo-acid Generator

In the invention, as the photo-acid generator, at least one kind of the compounds (b-1) each generating an acid by the irradiation of an active light or radiation and contributing to the decomposition reaction of the above-described acid-decomposing group [hereinafter, the compound is sometimes referred to as the photo-acid generator (b-1)] and at least one kind of the compounds (b-2) each generating an acid by the irradiation of an active light or radiation but not contributing to the decomposition reaction of the above-described acid-decomposing group [hereinafter, the compound is sometimes referred to as the photo-acid generator (b-2)] are used.

In the invention, the term "contribute to the decomposition reaction" means an action that when the film of the composition containing the compositions described above is formed and the film is irradiated by an active light or radiation, an acid generated from the photo-acid generator decomposes the protective group (the above-described acetal structure) protecting the alkali-soluble group of the alkali-soluble resin (a) and greatly increases the dissolving rate of the composition film in a developer.

Also, in the invention, the term "not contribute to the decomposition reaction" means an action that when the film of the composition containing the compositions described above is formed and the film is irradiated by an active light or radiation, an acid generated from the photo-acid generator does not decompose the protective group (the above-described acetal structure) protecting the alkali-soluble group of the alkali-soluble resin (a) and does not change the dissolving rate of the composition film in a developer.

The photo-acid generator (b-1) is a compound generating an acid capable of decomposing the above-described specific acetal structure and practically, there are compounds described below in detail.

The compound (b-1) generating an acid by the irradiation of an active light or radiation includes, for example, the diazonium salts described in S. I. Schlesinger, "Photogr. Sci. Eng.", 18, 387(1974), T. S. Bal et al., "Polymer", 21, 423(1980), etc.; the ammonium salts described in U.S. Pat. Nos. 4,069,055, 4,069,056, and Re 27,992, JP-A-3-140140; the phosphonium salts described in D. C. Necker et al., "Macromolecules", 17, 2468(1984); C. S. Wen et al., Teh, "Proc. Conf. Rad. Curing ASIA", p. 478 Tokyo, October (1988); U.S. Pat. Nos. 4,069,055 and 4,069,056, etc.; the iodonium salts described in J. V. Crivello et al., "Macromolecules", 10(6), 1307(1977), "Chem. & Eng. News", November 28, 31(1988); European Patents 104143, 339049, and 410201, JP-A-2-150848, and JP-A-2-296514, etc.; the sulfonium salts described in J. V. Crivello et al., "Polymer J.", 17, 73(1985), C. V. Crivello et al.; "J. Org. Chem.", 43. 3055(1978); W. R. Watt et al., "J. Polymer Sci.", Polymer Chem. Ed., 22, 1789(1984); J. V. Crivello et al., "Polymer Bull.", 14, 279(1985); J. V. Crivello et al., "Macromolecules", 14(5), 1141(1981); J. V. Crivello et al., "Polymer Sci.", Polymer Chem. Ed., 17, 2877(1979); European Patents 370693, 161811, 410201, 339149, 233567, 297443, and 297442, U.S. Pat. Nos. 4,933,377, 3,902,114, 4,760,013, 4,734,444, and 2,833,827, German Patents 2,904, 626, 3,604,580, and 3,604,581, etc.; selenonium salts described in J. V. Crivello et al., "Macromolecules", 10(6), 1307(1977), J. V. Crivello et al., "J. Polymer Sci.", Polymer Chem. Ed., 17, 1047(1979), etc.; the onium salts such as the arsonium salts, etc., described in C. S. Wen et al., Teh, "Proc. Conf. Rad. Curing ASIA", p478, Tokyo, October (1988), etc.; the organic halogen compounds described in U.S. Pat. No. 3,905,815, Japanese Patent Publication No. 46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, etc.; the organometal/organic halides described in K. Meier et al., "J. Rad. Curing", 13(4), 26(1986), T. P. Gill et al., "Inorg. Chem.", 19, 3007(1980), D Astruc, "ACC. Chem. Res.", 19(12), 377(1986), JP-A-2-161445, etc.; the photo-acid generators having an o-nitrobenzyl type protective group described in S. Hayase et al., "J. Polymer Sci.", 25, 753 (1987), E. Reichmanis et al., "J. Polymer Sci.", Polymer Chem. Ed., 23. 1(1985), Q. Q. Zhuetal, "J. Photochem.", 36, 85, 39, 317(1987), B. Amit et al., "Tetrahedron Lett.", (24), 2205(1973), D. H. R. Barton et al., "J. Chem. Soc.", 3571 (1965), P. M. Collins et al, "J. Chem. Soc.", Perkin I, 1695(1975), M. Rudinstein et al., "Tetrahedron Lett." (17), 1445(1975), J. W. Walker et al., "J. Am. Chem. Soc.", 110, 7170(1988), S. C. Busman et al., "J. Imaging Technol.", 11(4), 191(1985), F. M. Houlihan et al., "Macromolecules", 21, 2001(1988), P. M. Collins et al., "J. Chem. Soc., Commun.", 532 (1972), S. Hayase et al., "Macromolecules", 18, 1799(1985), E. Reichmanis et al., "J. Electrochem. Soc.", Solid State Sci. Technol., 130(6), F. M. Houlihan et al., "Macromolecules", 21, 2001(1988), European Patents 0290750, 046083, 156535, 271851, and 0388343, U.S. Pat. Nos. 3,901,710 and 4,181,531, JP-A-60-198538 and JP-A-53-133022, etc.; the compounds each generating sulfonic acid by causing a photodecomposition, typified by iminosulfonate, etc., described in M. TUNOOKA et al, "Polymer Preprints Japan", 35(8), G. Berner et al., "J. Rad. Curing, 13(4); W. J. Mijs et al., "Coating Technol.", 55(697), 45(1983); Akzo, H. Adachi et al., "Polymer Preprints, Japan", 37(3); European Patents 0199672, 84515, 044115, 618564, and 0101122, U.S. Pat. Nos. 4,371,605 and 4,431,774, JP-A-64-18143, JP-A-2-245756, and JP-A-3-140109, etc.; and the disolfone compounds described in JP-A-61-166544, etc.

Also, as the compound having introduced a group or a compound generating an acid by the irradiation of an active light or radiation to the main chain or the side chain of the polymer, the compounds described, for example, in M. E. Woodhouse et al, "J. Am. Chem. Soc.", 104, 5586(1982); S. P. Pappas et al.; "J. Imaging Sci.", 30(5), 218(1986); S. Kondo et al., "Makromol. Chem.", Rapid Commun., 9, 625 (1988), Y. Yamada et al., "Makromol. Chem.", 152, 153, 163(1972); J. V. Crivello et al., "Polymer Sci.", Polymer Chem. Ed. 17, 3849(1979), U.S. Pat. No. 3,849,137, German Patent 3914407, JP-A-63-26653, JP-A-60-164824, JP-A-62-69263, JP-A-63-146038, JP-A-63-163452, JP-A-62-153853, and JP-A-63-146029, etc., can be used.

Furthermore, the compounds each generating an acid by light described in V. N. R. Pillai, "Synthesis", (1), 1(1980); A. Abad et al., "Tetrahedron Lett.", (47), 4555(1971); D. H. R. Barton et al., "J. Chem. Soc.", (C), 329(1970), U.S. Pat. No. 3,779,778, German Patent 126712, etc., can be also used.

In the above-described compounds (b-1) each generating an acid by being decomposed by the irradiation of an active light or radiation, the compounds particularly effective used are explained below.

(1) The oxazole derivatives each shown by following formula (PAG 1) having a substituted trihalomethyl group or the S-triazine derivatives each shown by formula (PAG 2).

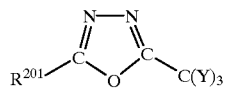

(PAG1)

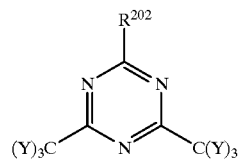

(PAG2)

In the above formulae, $R^{201}$ represents a substituted or unsubstituted aryl group or alkenyl group; $R^{202}$ represents a substituted or unsubstituted aryl group, alkenyl group, alkyl group, or $—C(Y)_3$; and Y represents a chlorine atom or a bromine atom.

Practical compounds are illustrated below but the compounds are not limited to these compounds.

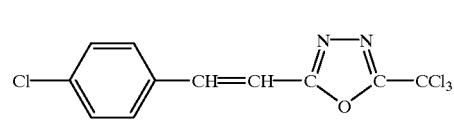

(PAG1-1)

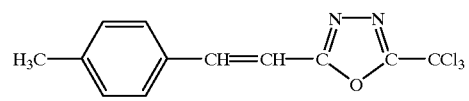

(PAG1-2)

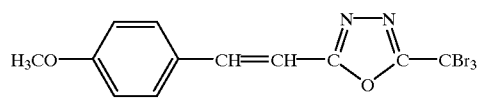

(PAG1-3)

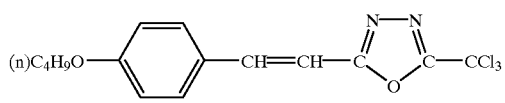

(PAG1-4)

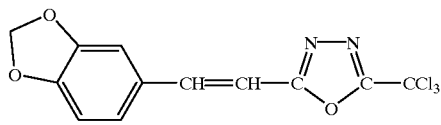

(PAG1-5)

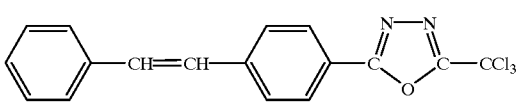

(PAG1-6)

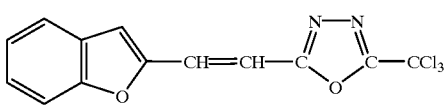

(PAG1-7)

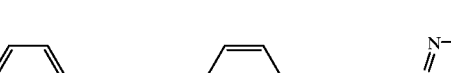

(PAG1-8)

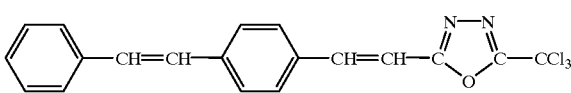

(PAG2-1)

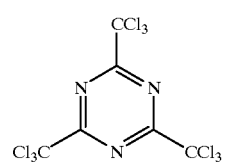

-continued
(PAG2-2)
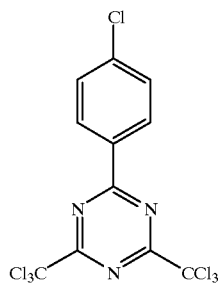
(PAG2-3)
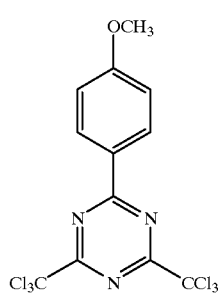
(PAG2-4)
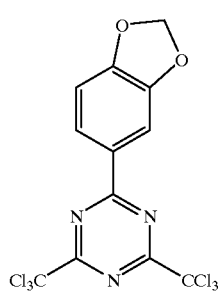
(PAG2-5)
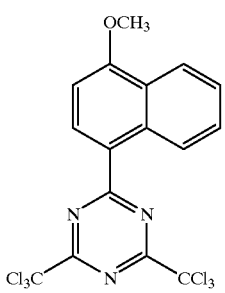
(PAG2-6)
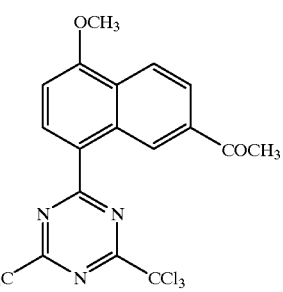
-continued
(PAG2-7)
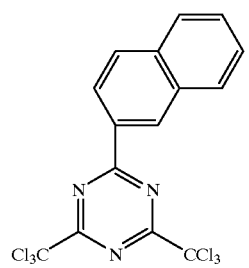
(PAG2-8)
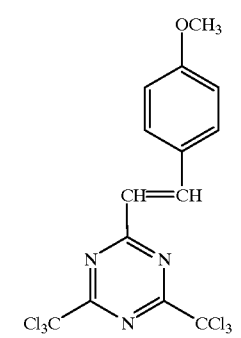
(PAG2-9)
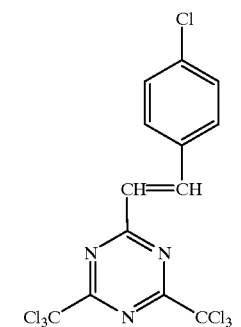
(PAG2-10)
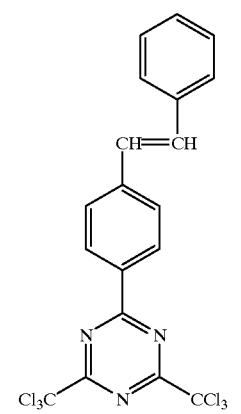
(2) The iodonium salts shown by following formula (PAG 3) or the sulfonium salts shown by following formula (PAG 4).

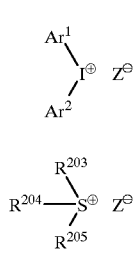

(PAG3)

(PAG4)

In the above formulae, $Ar^1$ and $Ar^2$ each independently represents a substituted or unsubstituted aryl group. As the preferred substituent, there are an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$, $R^{205}$ each independently represents a substituted or unsubstituted alkyl group or a substituted or unsubstituted aryl group. Each is preferably an aryl group having from 6 to 14 carbon atoms or an alkyl group having from 1 to 8 carbon atoms, and each of the substituted derivatives of these groups.

As the preferred substituents, for the aryl group, there are an alkoxy group having from 1 to 8 carbon atoms, an alkyl group having from 1 to 8 carbon atoms, a cycloalkyl group, a nitro group, a carboxyl group, a mercapto group, a hydroxy group, and a halogen atom, and for the alkyl group, there are an alkoxy group having from 1 to 8 carbon atoms, a carboxyl group, and an alkoxycarbonyl group.

$Z^-$ represents a counter anion and includes, for example, $BF_4^-$, $AsF_6^-$, $PF_6^-$, $SbF_6^-$, $SiF_6^-$, $ClO_4^-$, an alkanesulfonic a anion which may be substituted, a benzenesulfonic acid anion which may be substituted, a naphthalenesulfonic acid anion which may be substituted, an anthracenesulfonic acid anion which may be substituted, a camphasulfonic acid anion which may be substituted, and a sulfonic acid group-containing dye, although the counter anion is not limited to them.

Also, two of $R^{203}$, $R^{204}$, and $R^{205}$, or $Ar^1$ and $Ar^2$ may combine with each other via a single bond or a substituent.

Also, a photo-acid generator showing less change of the performance (T-Top formation, line width change, etc.) with the passage of time after exposure to a heat treatment is preferred. As such a photo-acid generator, there is, for example, the compound shown by the above-described formula (PAG 3) or (PAG 4), wherein $Ar^1$, $Ar^2$, and $R^{203}$ to $R^{205}$ each represents a substituted or unsubstituted aryl group and $Z^-$ shows a relatively low diffusibility in the resist film when it generates as an acid by the irradiation of light. Practically, there is a benzenesulfonic acid anion, a naphthalenesulfonic acid anion, or an anthracenesulfonic acid anion each having at least one group selected from branched or cyclic alkyl and alkoxy groups each having at least 8 carbon atoms, at least two groups selected from straight chain, branched, or cyclic alkyl groups each having from 4 to 7 carbon atoms and alkoxy groups, or at least three groups selected from straight chain or branched alkyl groups each having from 1 to 3 carbon atoms and alkoxy groups.

Practical examples of the compound are shown below but the compounds used in the invention are not limited to these compounds.

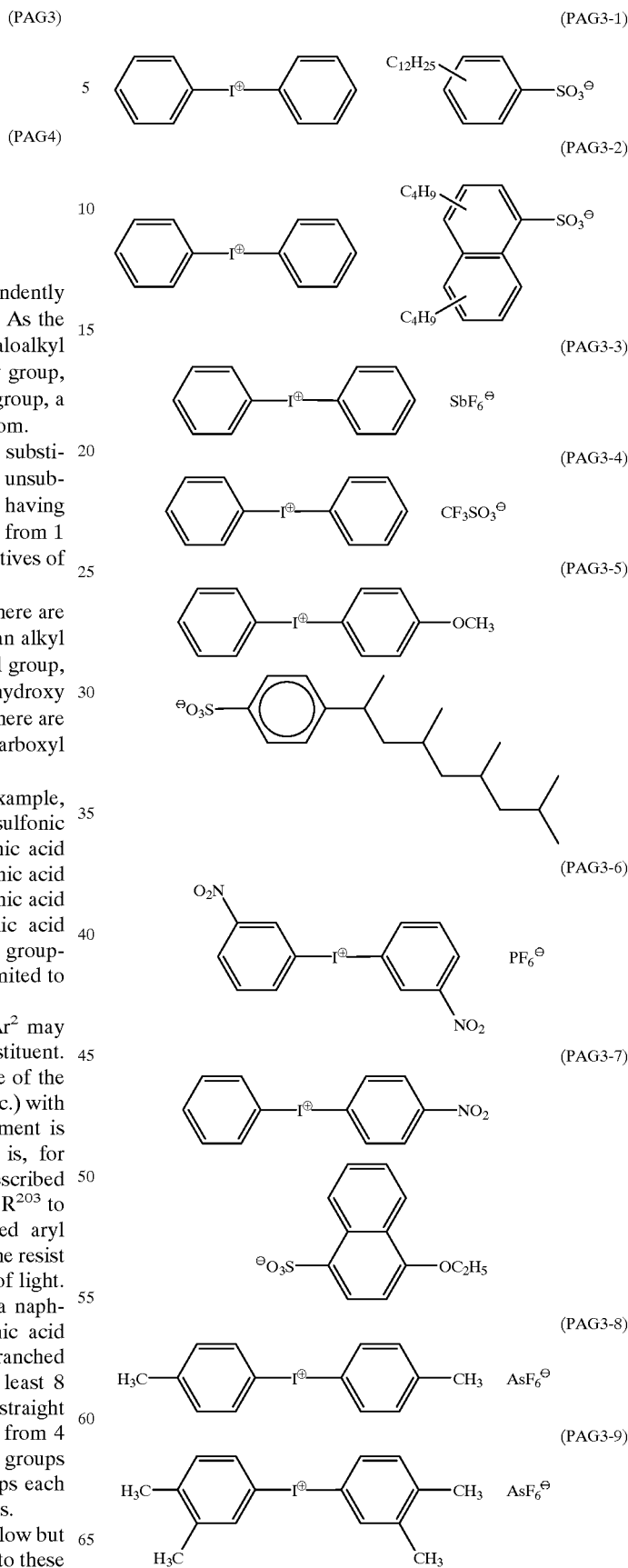

-continued
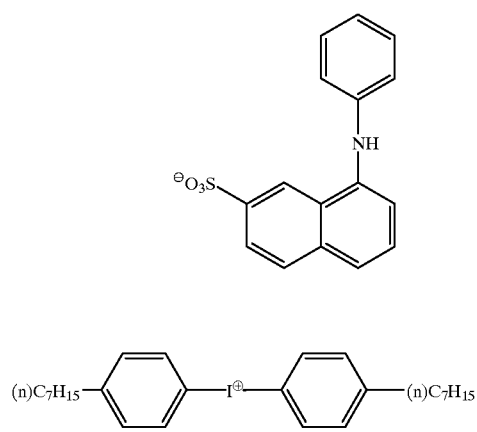
(PAG3-10)
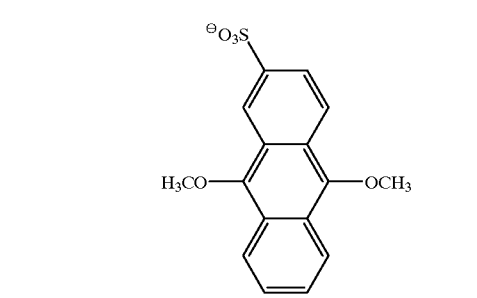
(PAG3-11)
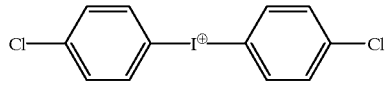
(PAG3-12)
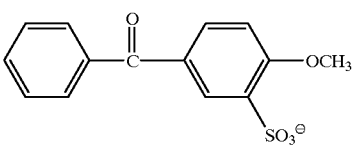
(PAG3-13)
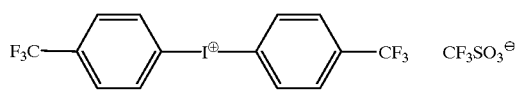
(PAG3-14)
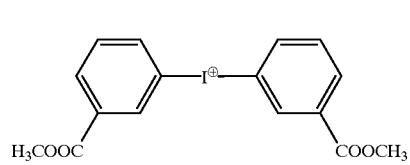
-continued
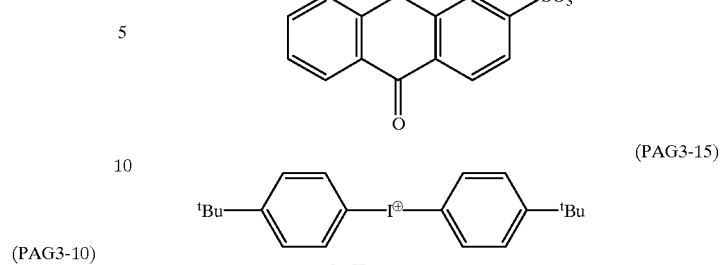
(PAG3-15)
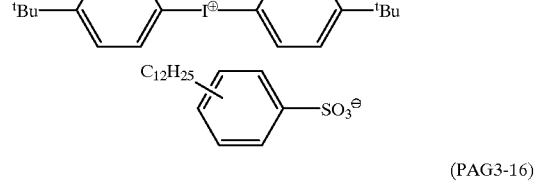
(PAG3-16)
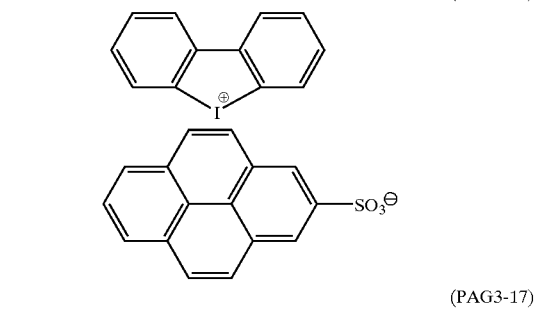
(PAG3-17)
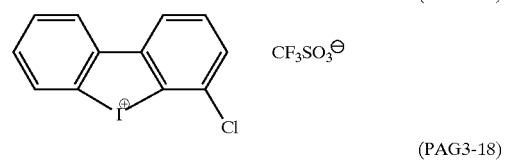
(PAG3-18)
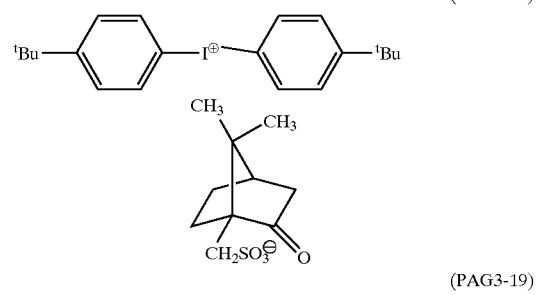
(PAG3-19)
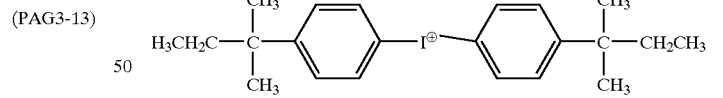
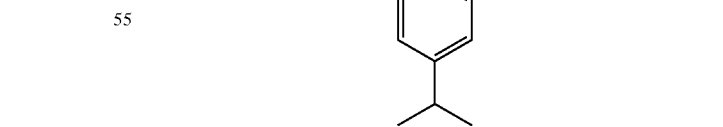
(PAG3-20)
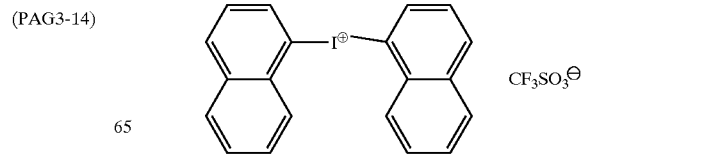

(PAG3-21)
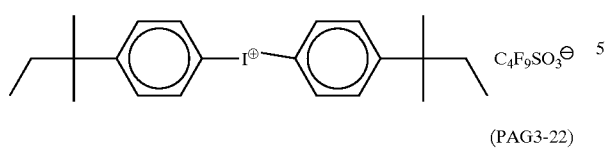
(PAG3-22)
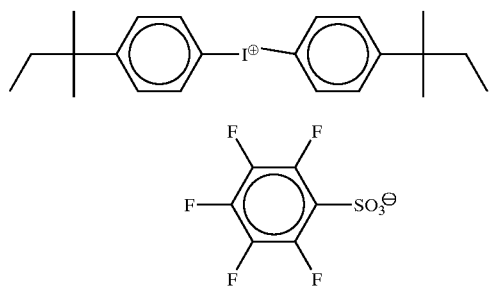
(PAG4-1)
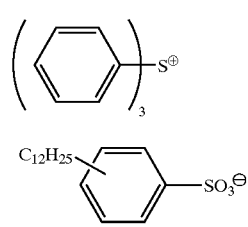
(PAG4-2)
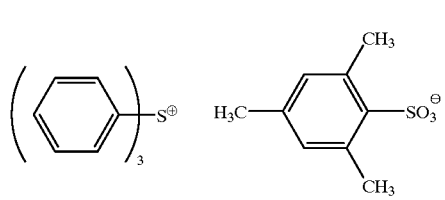
(PAG4-3)
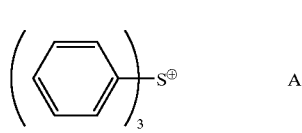
(PAG4-4)
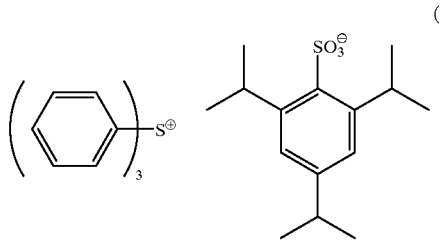
(PAG4-5)
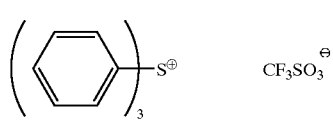
(PAG4-6)
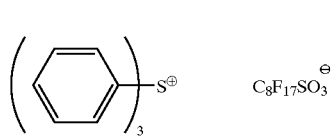
(PAG4-7)
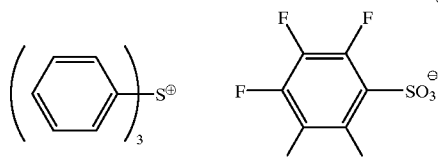
(PAG4-8)
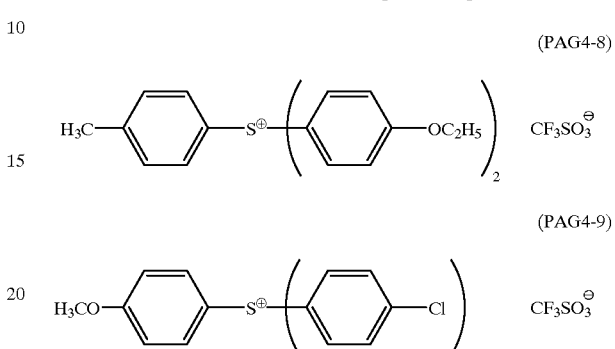
(PAG4-9)
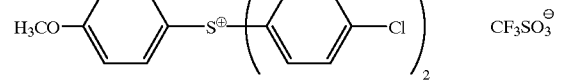
(PAG4-10)
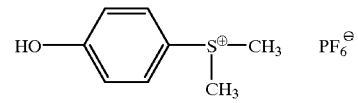
(PAG4-11)
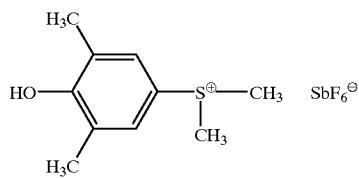
(PAG4-12)
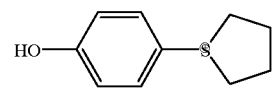
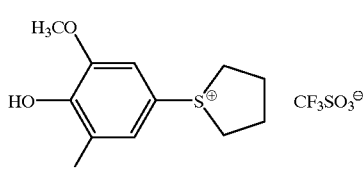
(PAG4-13)
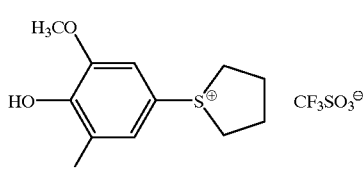
(PAG4-14)
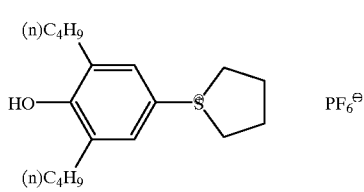

-continued
(PAG4-15)
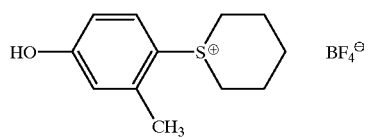
(PAG4-16)
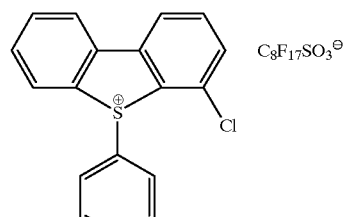
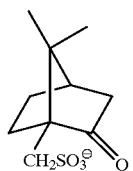
(PAG4-17)
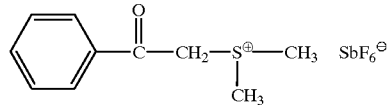
(PAG4-18)
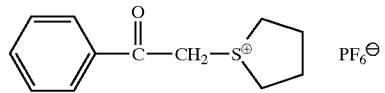
(PAG4-19)
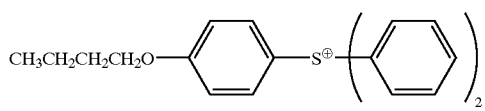
(PAG4-20)
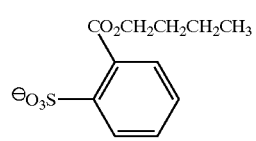
(PAG4-21)
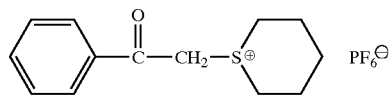
(PAG4-22)
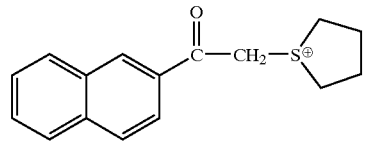
-continued
(PAG4-23)
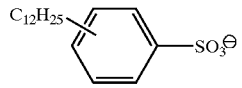
(PAG4-24)
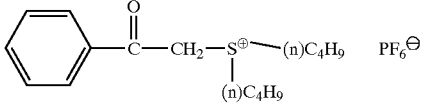
(PAG4-25)
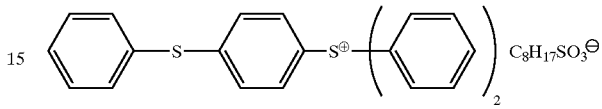
(PAG4-26)
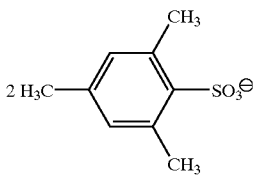
(PAG4-27)
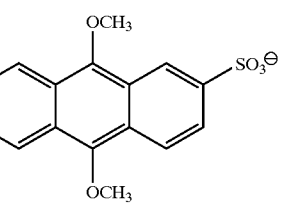
(PAG4-28)
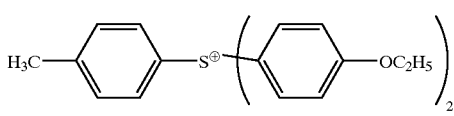
(PAG4-29)

(PAG4-30)

(PAG4-31)

(PAG4-32)

The above-described onium salts shown by the formulae (PAG 3) and (PAG 4) are known and can be synthesized by the methods described, for example, in J. W. Knapczyk et al., "J. Am. Chem. Soc.", 91, 145(1969); A. L. Maycok et al., "J. Org. Chem.", 35, 2532(1970); E. Goethas et al., "Bull. Soc. Chem. Belg.", 73, 546(1964); H. M. Leicester, "J. Am. Chem. Soc.", 51, 3587(1929); J. V. Crivello et al., "J. Polym. Chem. Ed.", 18, 2677(1980); U.S. Pat. Nos. 2,807,648 and 4,247,473, JP-A-53-101331, etc.

(3) The disulfone derivatives shown by the following formula (PAG 5) or the iminosulfonate derivatives shown by the following formula (PAG 6).

$$Ar^3-SO_2-SO_2-Ar^4$$ (PAG5)

(PAG6)

$$R^{206}-SO_2-O-N\begin{pmatrix}O\\ \\O\end{pmatrix}A$$

In the above formulae, $Ar^3$ and $Ar^4$ each independently represents a substituted or unsubstituted aryl group; $R^{206}$ represents a substituted or unsubstituted alkyl group or aryl group; and A represents a substituted or unsubstituted alkylene group, alkenylene group, or arylene group.

As the practical examples, there are follow compounds, although the invention is not limited to these compounds.

(PAG5-1)

(PAG5-2)

(PAG5-3)

(PAG5-4)

(PAG5-5)

(PAG5-6)

(PAG5-7)

(PAG5-8)

(PAG5-9)
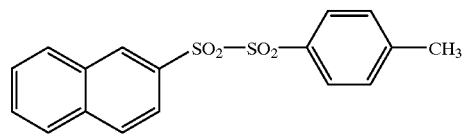
(PAG5-10)
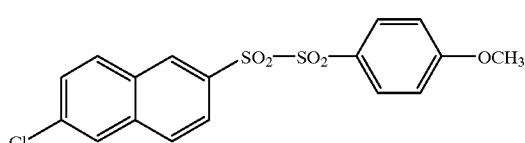
(PAG5-11)
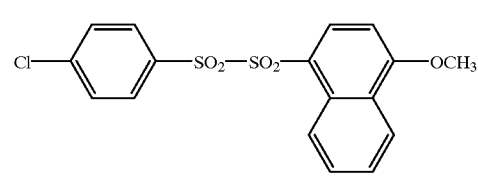
(PAG5-12)
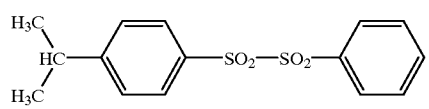
(PAG5-13)
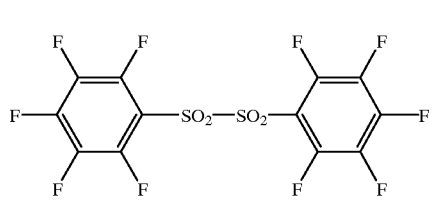
(PAG5-14)
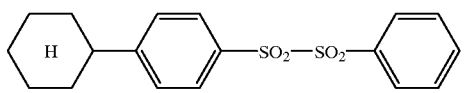
(PAG5-15)
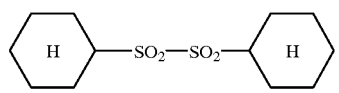
(PAG6-1)
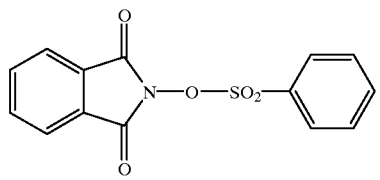
(PAG6-2)
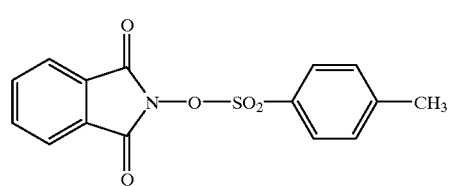
(PAG6-3)
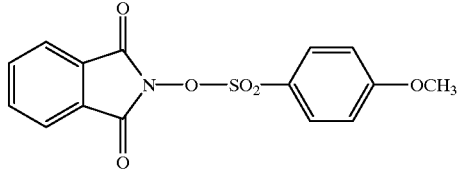
(PAG6-4)
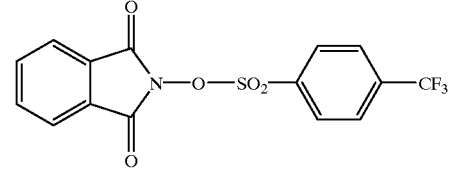
(PAG6-5)
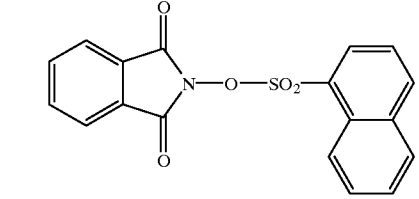
(PAG6-6)
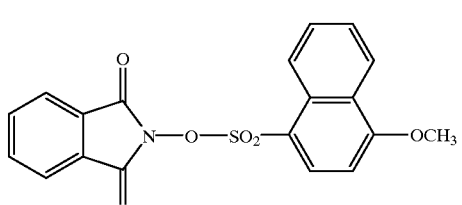
(PAG6-7)
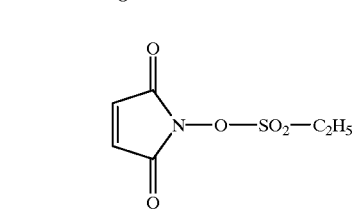
(PAG6-8)
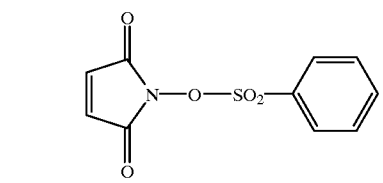
(PAG6-9)
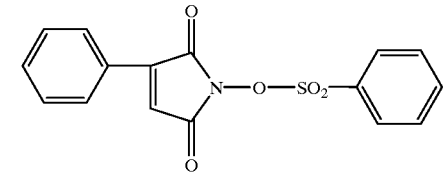
(PAG6-10)
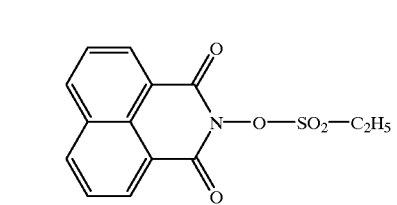

(PAG6-11) through (PAG6-18): chemical structures (continued)

(PAG6-19), (PAG6-20): chemical structures (4) The diazosulfone derivatives shown by following formula (PAG7).

(PAG7)

wherein R represents a straight chain, branched, or cyclic alkyl group which may be substituted.

Practical examples of the compound are shown below but the invention is not limited to these compounds.

(PAG7-1) through (PAG7-5): chemical structures

In the present invention, as the compound (b-1) generating an acid by the irradiation of an active light or radiation, the onium salts and diazosulfone are preferred and in these compound, the compound generating sulfonic acid is particularly preferred. Two or more kinds of these compounds may be mixed and in this case, the compounds having a similar structure, such as onium salts, may be mixed each other or the compounds each having a different skeleton, such as an onium salt and a diazodisolfone, etc., may be mixed.

The addition amount of the compound (b-1) generating an acid by being decomposed by the irradiation of an active light or radiation is in the range of usually from 0.001 to 40% by weight, preferably from 0.01 to 20% by weight, and more preferably from 0.1 to 5% by weight based on the total weight (excluding the coating solvent) of the composition of the invention.

The photo-acid generator (b-2) in the invention generates an acid by the irradiation of an active light or radiation but does not contribute to the decomposition of the above-described acid-decomposing resin. As such a photo-acid generator, a compound generating a carboxylic acid is preferred. Examples of the photo-acid generator include an iodonium salt or a sulfonium salt with an anion of a carboxylic acid as the counter anion and an imidocarboxylate compound or a nitrobenzyl ester compound having a carboxylic acid ester group.

As the photo-acid generator (b-2), which can be preferably used in the invention, there are illustrated the compounds represented by the formula (AI) to (AV) described below but the invention is not limited to these compounds.

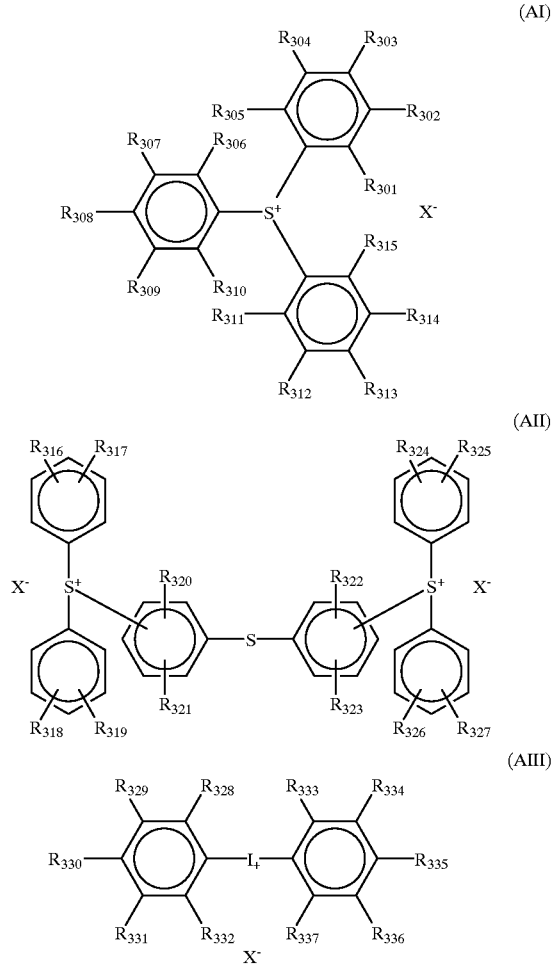

(AI)

(AII)

(AIII)

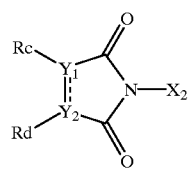

(AIV)

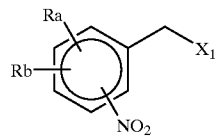

(AV)

In the above formulae, $R_{301}$ to $R_{337}$ each independently represents a hydrogen atom, a straight chain, branched, or cyclic alkyl group, a straight chain, branched, or cyclic alkoxy group, a hydroxy group, a halogen atom, or a —S—$R_0$ group (wherein $R_0$ represents a straight chain, branched, or cyclic alkyl group or an aryl group).

Also, Ra and Rb each independently represents a hydrogen atom, a nitro group, a halogen atom, an alkyl group which may have a substituent, or an alkoxy group which may have a substituent. Rc and Rd each independently represents a hydrogen atom, an alkyl group which may have a substituent, or an aryl group which may have a substituent. Rc and Rd may bond to each other to form an aromatic ring, monocyclic, or polycyclic hydrocarbon (the hydrocarbon may contain an oxygen atom or a nitrogen atom in the ring). $Y_1$ and $Y_2$ each represents a carbon atom and $Y_1$–$Y_2$ may be a single bond or a double bond. $X^-$ represents an anion formed from each of the carboxylic acid compounds shown by the following formulae. $X_1$ and $X_2$ each independently represents an ester group formed from each of the carboxylic compounds shown by the following formulae at the carboxyl group portion.

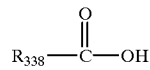

(C1)

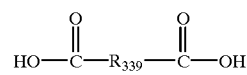

(C2)

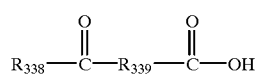

(C3)

(C4)

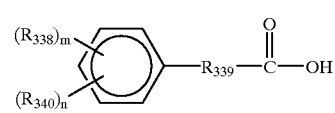

(C5)

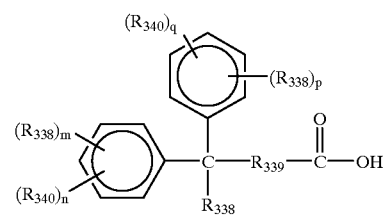

(C6)

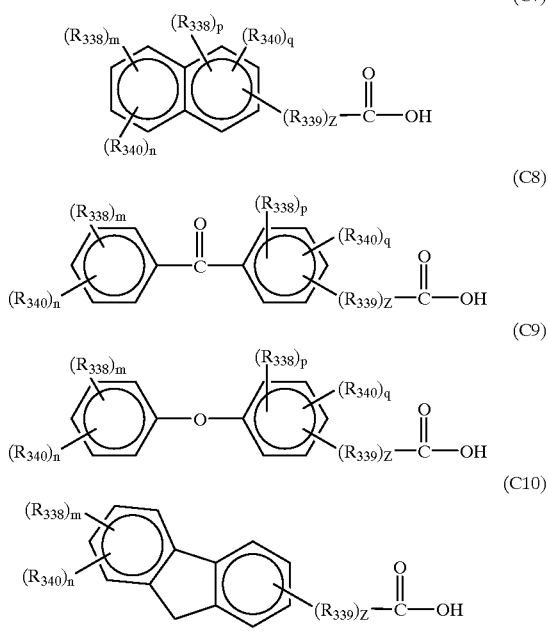

In the above-described formulae, $R_{338}$ represents a straight chain, branched, or cyclic alkyl group (wherein, the alkyl group may contain an oxygen atom or a nitrogen atom in the chain thereof) having from 1 to 30 carbon atoms, a straight chain, branched, or cyclic alkenyl group having from 1 to 20 carbon atoms, a straight chain, branched, or cyclic alkinyl group having from 1 to 20 carbon atoms, a straight chain, branched, or cyclic alkoxy group having from 1 to 20 carbon atoms, the above-describe alkyl group of which at least a part of the hydrogen atoms is substituted by a halogen atom and/or a hydroxy group, the above-described alkenyl group of which at least a part of the hydrogen atoms is substituted by a halogen atom and/or a hydroxy group, or a substituted or unsubstituted aryl group having from 6 to 20 carbon atoms. In this case, as the substituent of the aryl group, there are an alkyl group, a nitro group, a hydroxy group, an alkoxy group, an acyl group, an alkoxycarbonyl group, or a halogen atom.

$R_{339}$ represents a single bond, a straight chain, branched, or cyclic alkylene group having from 1 to 20 carbon atoms (wherein, the alkylene group may contain an oxygen atom or a nitrogen atom in the chain thereof), a straight chain, branched, or cyclic alkenylene group having from 1 to 20 carbon atoms, the above-described alkylene group of which at least a part of the hydrogen atoms thereof is substituted by a halogen atom and/or a hydroxy group, the above-described alkenylene group of which at least a part of the hydrogen atoms thereof is substituted by a halogen atom and/or a hydroxy group, or an alkoxyalkylene group having from 2 to 20 carbon atoms.

When plural $R_{338}$s and plural $R_{339}$s exist, they may be the same or different, respectively.

$R_{340}$ represents a hydroxy group or a halogen atom and when plural $R_{340}$s exist, they may be the same or different.

Also, m, n, p, and q each independently represents an integer of from 0 to 3, but m+n≦5, and p+q≦5. Also, z represents 0 or 1.

In the above-described formulae (AI) to (AV), as the straight chain or branched alkyl group in $R_{301}$ to $R_{337}$, Ra, Rb, Rc, Rd. and $R_0$, there is an alkyl group having from 1 to 4 carbon atoms, such as methyl, ethyl, propyl, n-butyl, sec-butyl, and tert-butyl, which may have a substituent. Also, as the cyclic alkyl group, there is a cyclic alkyl group having from 3 to 8 carbon atoms, such as cyclopropyl, cyclopentyl, and cyclohexyl, which may have a substituent.

As the alkoxy group shown by $R_{301}$ to $R_{337}$, Ra, and Rb, there is an alkoxy group having from 1 to 4 carbon atoms, such as methoxy, ethoxy, hydroxyethoxy, propoxy, n-butoxy, isobutoxy, sec-butoxy, and tert-butoxy.

As the halogen atom shown by $R_{301}$ to $R_{337}$, Ra, Rb, Rc, and Rd, there are a halogen atom such as fluorine, chlorine, bromine, and iodine.

As the aryl group shown by $R_0$, Rc, and Rd, there is an aryl group having from 6 to 14 carbon atoms, which may be substituted, such as phenyl, tolyl, methoxyphenyl, and naphthyl.

As the substituents for these groups which are substituted, preferably, there may be an alkoxy group having from 1 to 4 carbon atoms, a halogen atom (e.g., fluorine, chlorine, and iodine), an aryl group having from 6 to 10 carbon atoms, an alkenyl group having from 2 to 6 carbon atoms, a cyano group, a hydroxy group, a carboxyl group, an alkoxycarbonyl group, a nitro group, etc.

As the aromatic ring, monocyclic, or polycyclic hydrocarbon formed by bonding Rc and Rd (the hydrocarbon may contain an oxygen atom or a nitrogen atom in the ring), there are a benzene structure, a naphthalene structure, a cyclohexane structure, a norbornene structure, an oxabicyclo structure, etc.

The sulfonium compounds and the iodonium compounds shown by the formulae (AI) to (AIII), which is used in the invention, contain, as the counter anion X⁻, at least one kind of the compound, in the carboxylic acid compounds shown by the above-described formulae (C1) to (C10), of which the carboxyl group (—COOH) becomes an anion (—COO⁻).

The compound shown by the formula (AIV) or (AV), which is used in the invention, contains as a substituent $X_1$ or $X_2$, a substituent formed by becoming the carboxyl group (—COOH) of at least one compound in the carboxylic acid compounds shown by the above-described formulae (C1) to (C10) an ester group (—COO—).

As the straight chain, branched, or cyclic alkyl group having from 1 to 30 carbon atoms (the alkyl group may contain an oxygen atom or a nitrogen atom in the chain thereof) in $R_{338}$, there are methyl, ethyl, propyl, butyl, pentyl, hexyl, cyclohexyl, dodecyl, 1-ethoxyethyl, adamantyl, etc.

Also, as the straight chain, branched, or cyclic alkenyl group having from 1 to 20 carbon atoms, there are ethenyl, propenyl, isopropenyl, cyclohexene, etc.

As the straight chain, branched, or cyclic alkinyl group having from 1 to 20 carbon atoms, there are acetylene, propenylene, etc.

As the straight chain, branched, or cyclic alkoxy group having from 1 to 20 carbon atoms, there are methoxy, ethoxy, propyloxy, butoxy, cyclohexyloxy, isobutoxy, dodecyloxy, etc.

As the substituted or unsubstituted aryl group having from 6 to 20 carbon atoms, there are phenyl, naphthyl, anthranyl, etc.

As the substituent for the aryl group, there can be an alkyl group, a nitro group, a hydroxy group, an alkoxy group, an acyl group, an alkoxycarbonyl group, and a halogen atom.

In $R_{339}$, as the straight chain, branched, or cyclic alkylene group having from 1 to 20 carbon atoms (wherein, the alkylene group may contain an oxygen atom or a nitrogen atom in the chain thereof), there are methylene, ethylene, propylene, butylene, isobutylene, ethoxyethylene, cyclohexylene, etc.

As the straight chain, branched, or cyclic alkenylene group having from 1 to 20 carbon atoms, there are vinylene, allylene, etc.

In the invention, as the photo-acid generator (b-2), the iodonium salts and the sulfonium salts are preferred.

Practical examples of the photo-acid generator (b-2) are shown below, but the invention is not limited to these compounds.

(I-1)
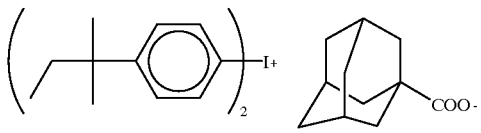

(I-2)
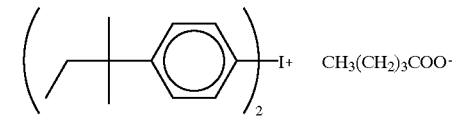

(I-3)
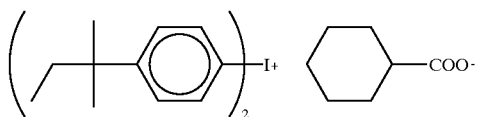

(I-4)
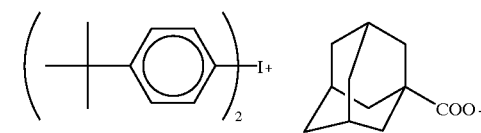

(I-5)
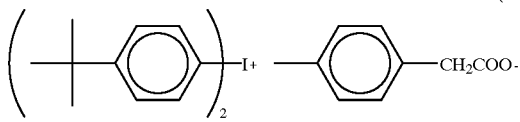

(I-6)
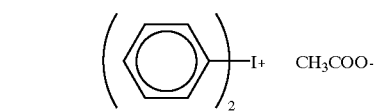

(I-7)
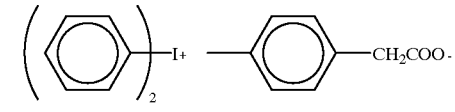

(I-8)
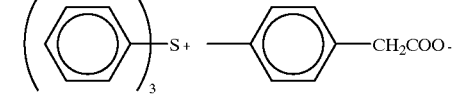

(I-9)
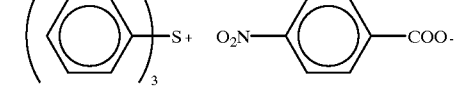

(I-9 cont.)
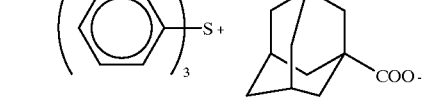

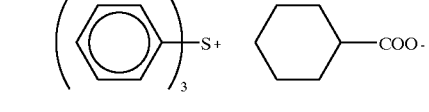

-continued

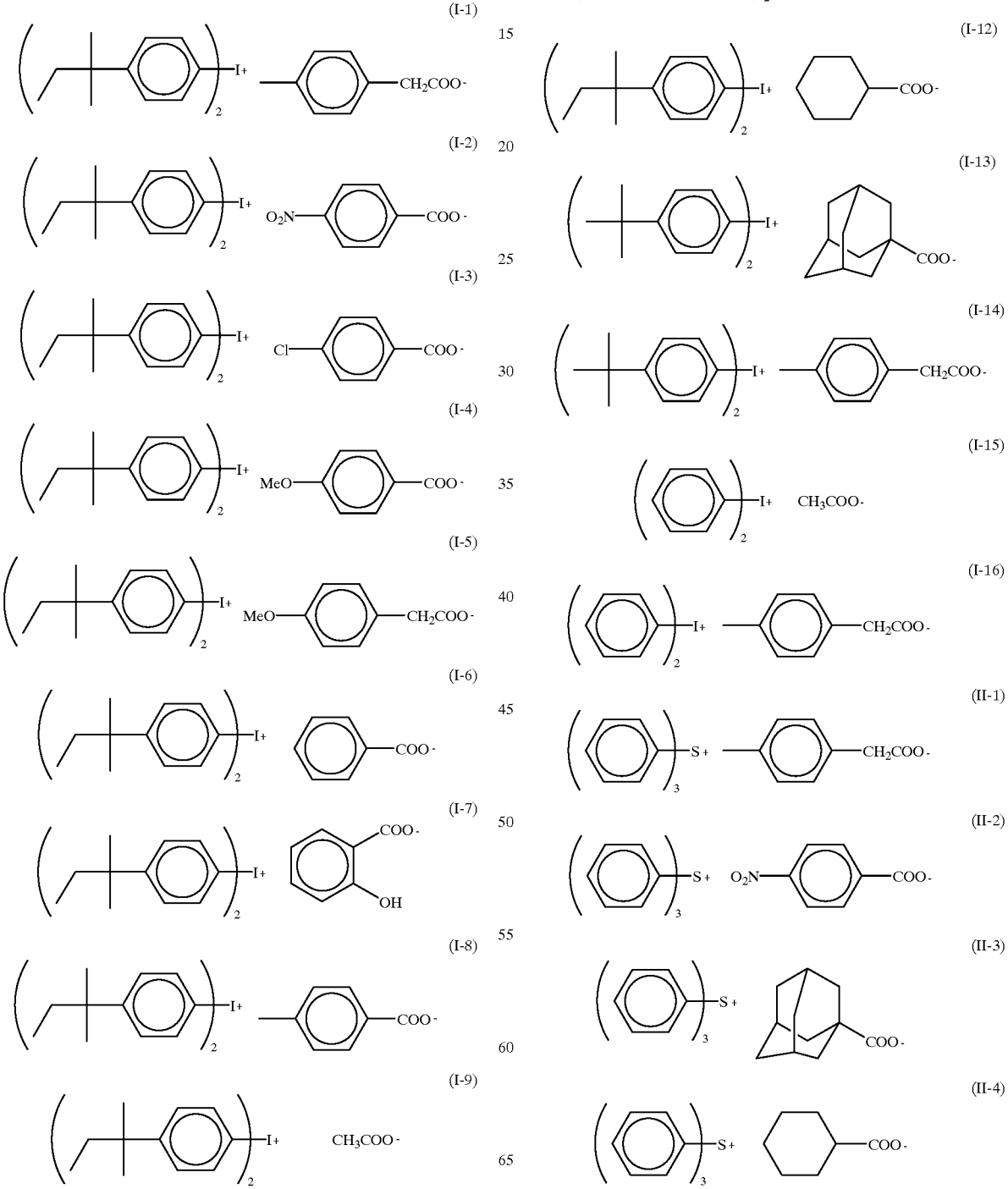

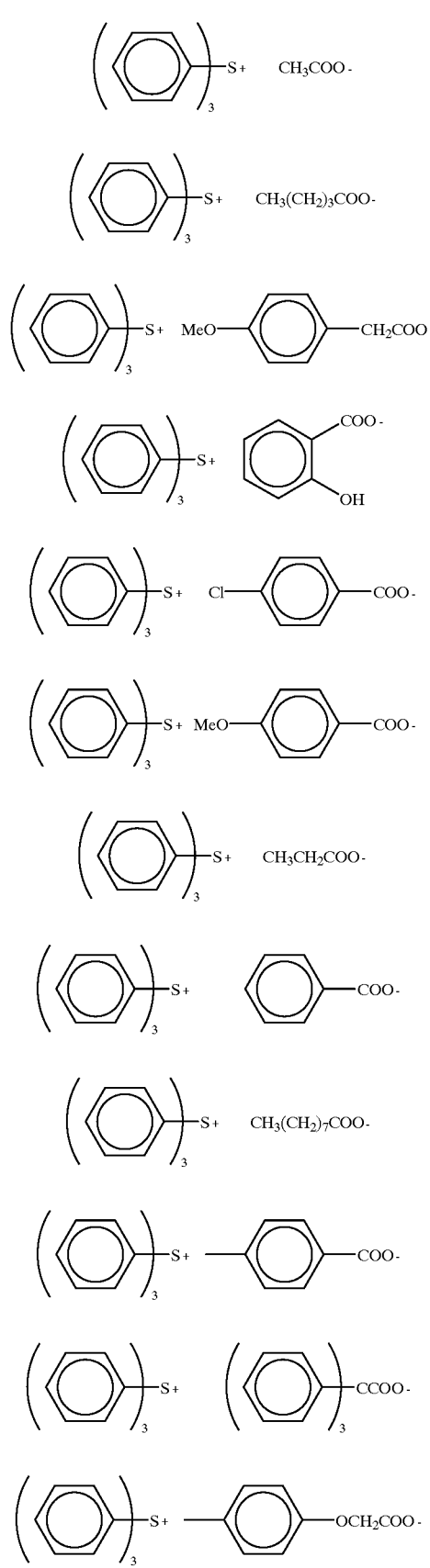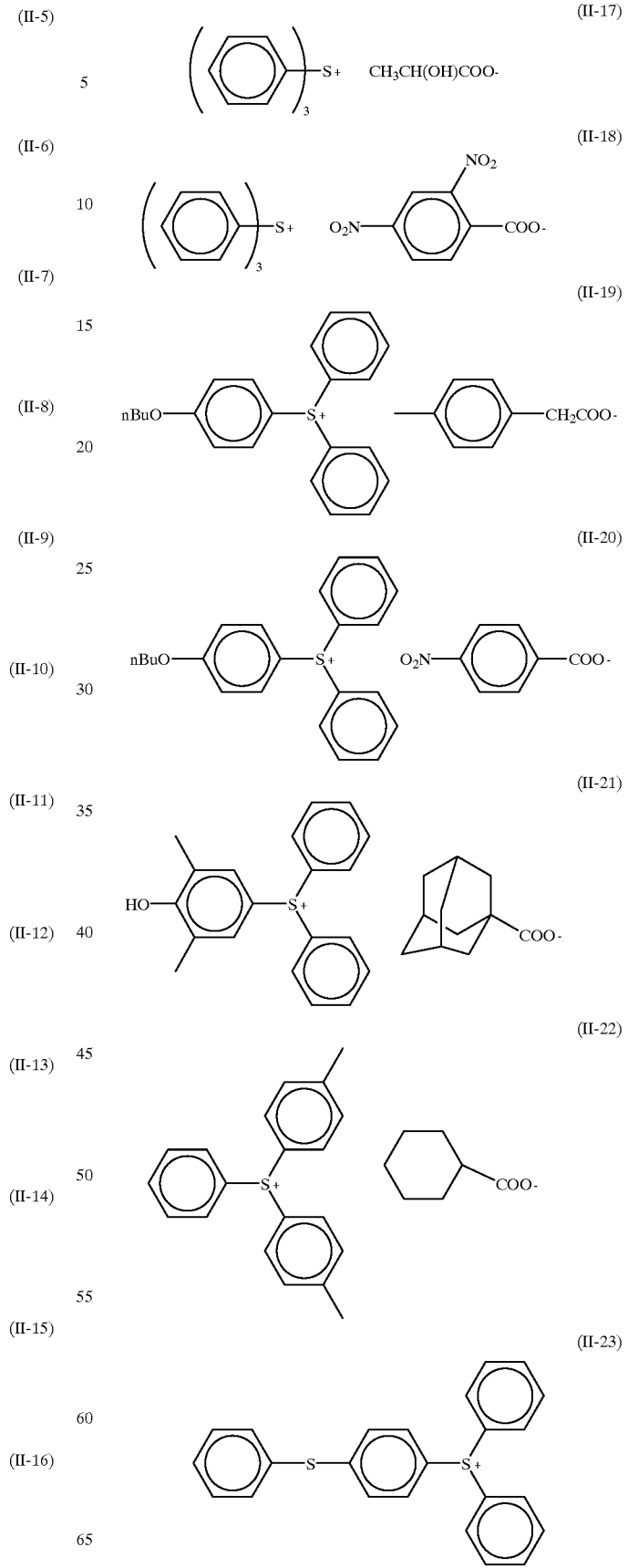

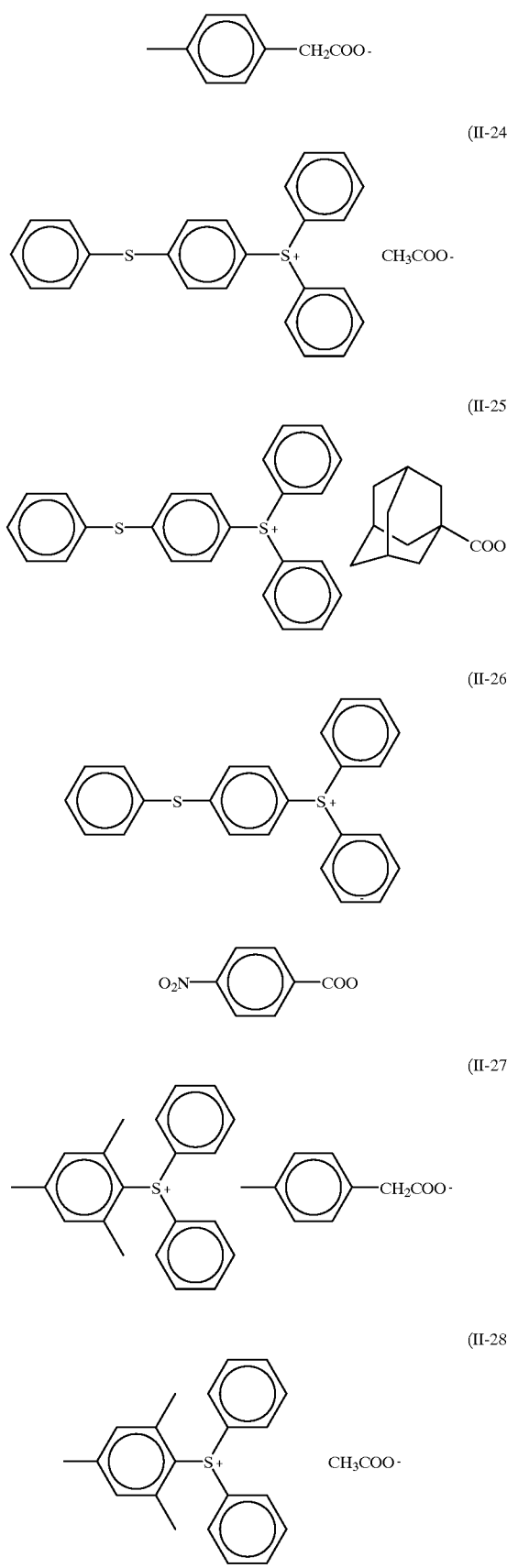

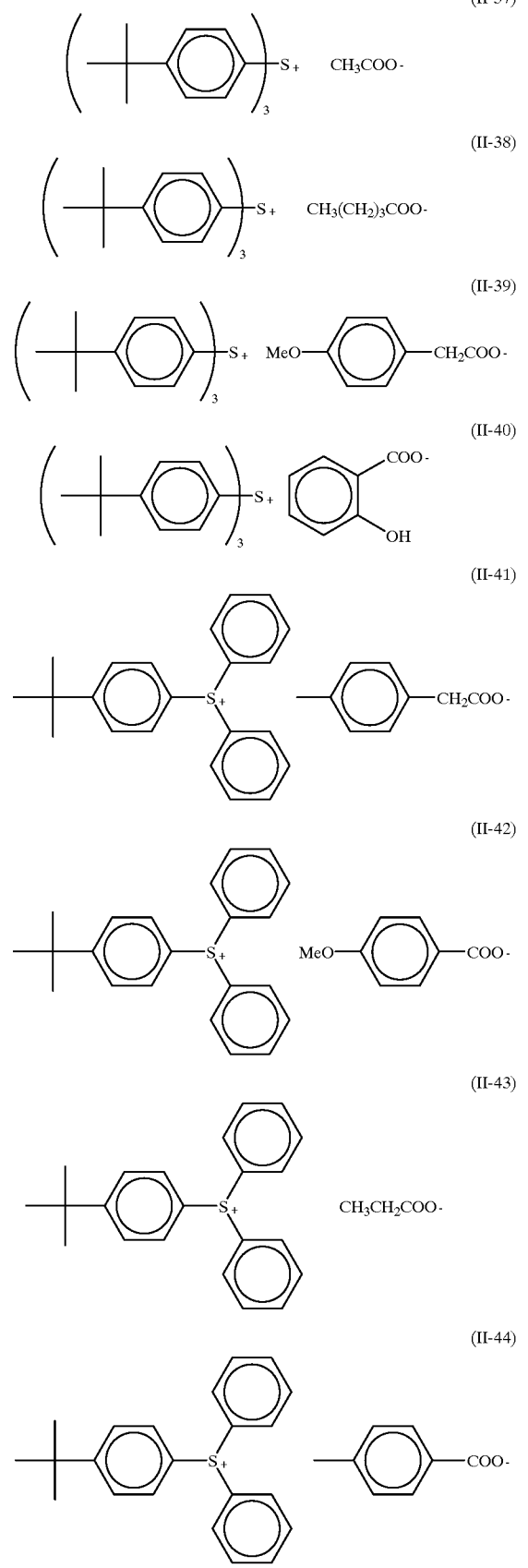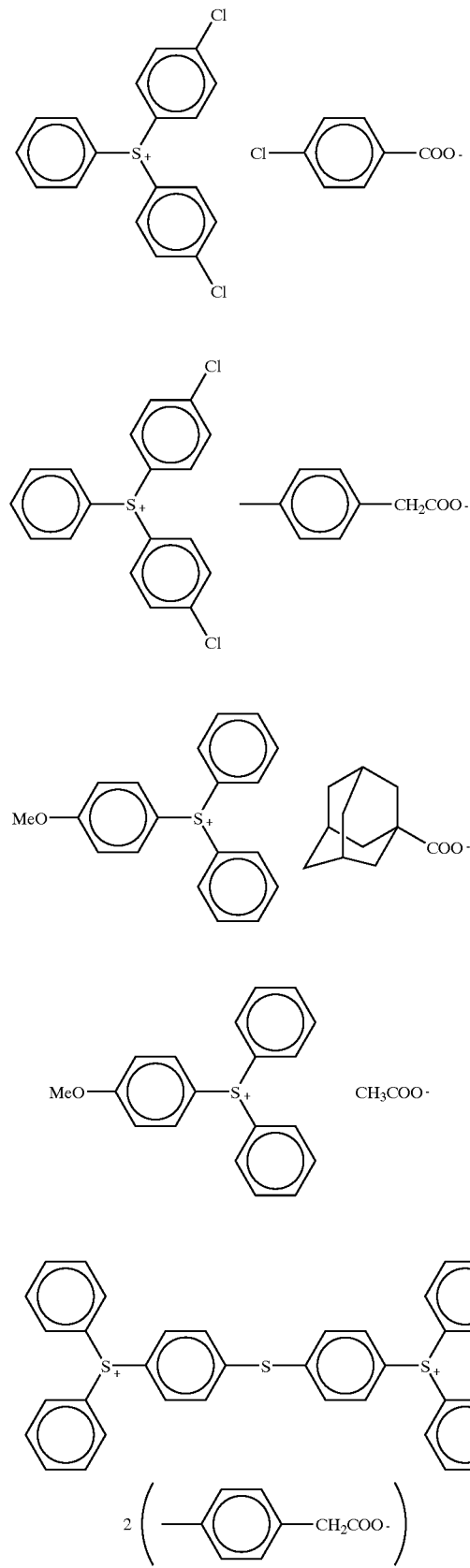

(III-2)

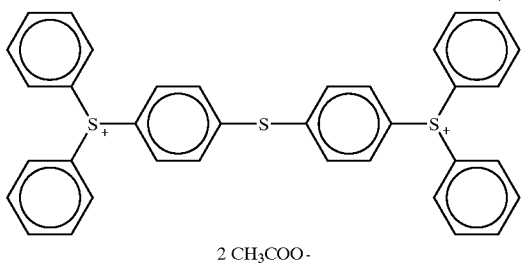

2 CH₃COO⁻

(IV-1)

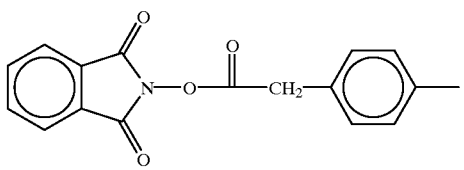

(IV-2)

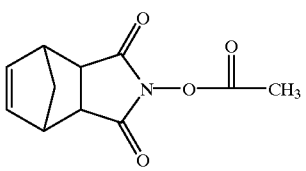

(IV-3)

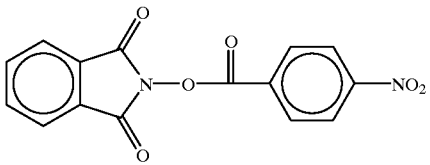

(IV-4)

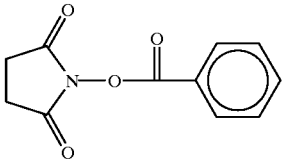

(V-1)

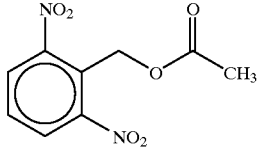

(V-2)

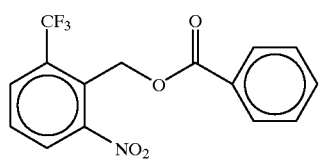

(V-3)

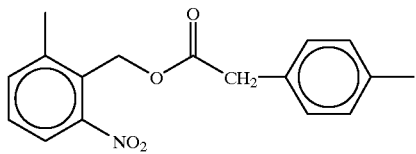

(V-4)

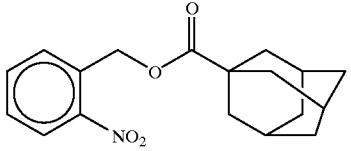

The compounds shown by the above-described formulae (AI) to (AV) can be used singly or as a combination of two or more kinds of them.

The above-described light acid-generating compound (b-2), that is, the compounds shown by the formula (AI), the formula (AII), or the formula (AIII) can be synthesized by using the method described in U.S. Pat. No. 3,734,928, the methods described in "Macromolecules", vol. 10, 1307 (1977), "Journal of Organic Chemistry", Vol. 55, 4222 (1990), "J. Radiat. Curing", Vol. 5(1), 2(1978), etc., and further by exchanging the counter anion. The compound shown by the formula (AIV) or (AV) can be obtained by reacting an N-hydroxyimide compound and a carboxylic acid chloride under a basic condition, or by reacting nitrobenzyl alcohol and a carboxylic acid chloride under a basic condition.

The content of the photo-acid generator (b-2) in the composition of the invention is properly from 0.1 to 20% by weight, preferably from 0.5 to 10% by weight, and more preferably from 1 to 7% by weight to the whole solid components of the composition.

Also, the using weight ratio of the photo-acid generator (b-1) and the photo-acid generator is, as (b-2)/(b-1), in the range of usually from 0.01 to 5, preferably from 0.05 to 3, and more preferably from 0.1 to 2.

It is preferred to use an organic basic compound for the composition of the invention.

A preferred organic basic compound which can be used in the invention is the compounds having a stronger basicity than phenol. In these compounds, the nitrogen-containing basic compounds having the structures shown by following formulae (A) to (E) are preferable. By using the nitrogen-containing basic compound, the change of the performance of the composition by the passage of time from a exposure to a post heat treatment is less.

(A)

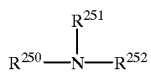

wherein, $R^{250}$, $R^{251}$, and $R^{252}$ each independently represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and in this case, $R^{251}$ and $R^{252}$ may combine with each other to form a ring.

(B)

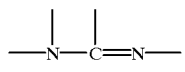

(C)

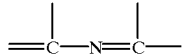

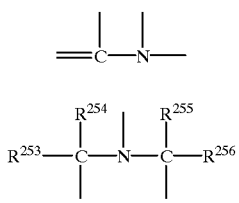

(D)

(E)

In the formula (E), $R^{253}$, $R^{254}$, $R^{255}$ and $R^{256}$ which may be same or different, each represents an alkyl group having from 1 to 6 carbon atoms.

As the preferred practical examples of the organic basic compounds, there are substituted or unsubstituted guanidine, substituted or unsubstituted aminopyridine, a substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, a substituted or unsubstituted aminoalkylmorpholine, etc., and further, there are mono-, di-, tri-alkylamine, substituted or unsubstituted aniline, substituted or unsubstituted piperidine, mono- or di-ethanolamine, etc. The preferred substituent includes an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group, and a cyano group.

Preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicyclo[5,4,0] undeca-7-ene, 2,4,5-triphenyl-imidazole, tri(n-butyl)amine, tri(n-octyl)amine, N-phenyldiethanolamine, N-hydroxyethylpiperidine, 2,6-diisopropylaniline, N-cyclohexyl-N'-morpholinoethyl thiourea, N-hydroxyethylmorpholine, etc., but the invention is not limited to these compounds.

In these compounds, the particularly preferred compounds include 1,5-diazabicyclo[4,3,0]nona-5-ene, 1,8-diazabicyclo[5,4,0]undeca-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethyl thiourea, and N-hydroxyethylmorpholine.

These nitrogen-containing basic compounds may be used singly or as a mixture of two or more kinds thereof. The using amount of nitrogen-containing basic compound is usually from 0.001 to 10% by weight, and preferably from 0.01 to 5% by weight. When the using amount is less than 0.001% by weight, the effect of adding the above-described nitrogen-containing basic compound is not obtained. On the other hand, when the addition amount exceeds 10% by weight, there are tendency of lowering the sensitivity and deteriorating the developing property of the non-exposed area.

[VII] Other components used in the invention

The positive-working radiation-sensitive composition of the present invention can further contain, if necessary, a dye, a pigment, a plasticizer, a surface active agent, a spectral sensitizer, a low molecule weight dissolution-inhibiting compound, a compound having at least two phenolic OH groups accelerating the solubility in a developer, etc.

The compound having at least two phenolic OH groups, which can be used in the invention, is a phenol compound having a molecular weight of not more than 1000. Also, it is necessary that the compound has at least two phenolic hydroxy groups in the molecule but when the number of the phenolic hydroxy groups exceeds 10, the effect of improving the development latitude is lost. Also, when the ratio of the phenolic hydroxy groups and an aromatic ring is less than 0.5, there are tendencies that the film thickness dependency becomes large and the development latitude is narrowed. Also, the ratio exceeds 1.4, the stability of the composition of the invention is deteriorated and it becomes difficult to obtain a high resolution and the good film thickness dependency, which are undesirable.

The addition amount of the phenol compound is preferably from 2 to 50% by weight, and more preferably from 5 to 30% by weight to the weight of the alkali-soluble resin described above. When the addition amount exceeds 50% by weight, the development residue is deteriorated and a new fault that a pattern is deformed at development undesirably occurs.

The phenol compound having a molecular weight of not more than 1000 as described above can be easily synthesized by persons skilled in the art by referring to the methods described, for example, in JP-A-4-122938 and JP-A-2-28531, U.S. Pat. No. 4,916,210, European Patent 219294, etc.

Practical examples of the phenol compounds are shown below but the compounds which can be used in the invention are not limited to these compounds.

That is, there are resorcin, phloroglucin, 2,3,4-trihydroxybenzophenone, 2,3,4,4'-tetrahydroxy-benzophenone, 2,3,4,3',4',5'-hexahydroxybenzophenone, an acetone-pyrogallol condensed resin, phloroglucoxide, 2,4,2',4'-biphenyltetrol, 4,4'-thiobis(1,3-dihydroxy)benzene, 2,2', 4,4'-tetrahydroxy diphenyl ether, 2,2',4,4'-tetrahydroxy diphenyl sulfoxide, 2,2',4,4'-tetrahydroxy diphenyl sulfone, tris(4-hydroxyphenyl)methane, 1,1-bis(4-hydroxyphenyl) cyclohexane, 4.4-(α-methylbenzylidene)-bisphenol, α,α', α"-tris(4-hydroxyphenyl)-1,3,5-tri-isopropylbenzene, α,α', α"-tris(4-hydroxyphenyl)-1-ethyl-4-isopropylbenzene, 1,2,2-tris(hydroxyphenyl)propane, 1,1,2-tris(3,5-dimethyl-hydroxyphenyl)propane, 2,2,5,5-tetrakis(4-hydroxyphenyl) hexane, 1,2-tetrakis(4-hydroxy-phenyl)ethane, 1,1,3-tris (hydroxyphenyl)butane, para[α,α,α', a'-tetrakis(4-hydroxyphenyl)]-xylene, etc.

As suitable dyes which can be used in the invention, there are oil-soluble dyes and basic dyes.

Practically, there are Oil Yellow #101, Oil Yellow #103, Oil Pink #312, Oil Green BG, Oil Blue BOS, Oil Blue #603, Oil Black BY, Oil Black BS, Oil Black T-505 (all the dyes described above, manufactured by Orient Kagaku Kogyo K.K.), Crystal Violet (CI 42555), Methyl Violet (CI 42535), Rhodamine B (CI 45170B), Malachite Green (CI 42000), Methylene Blue (CI 52015), etc.

Furthermore, by adding the spectral sensitizers shown below to sensitize the longer wavelength region than far ultraviolet at which the photo-acid generators used in the invention does not have an absorption, whereby it is possible that the photosensitive composition of the invention has a sensitivity to the i-line or g-line. Practical examples of the suitable spectral sensitizers include benzophenone, p,p'-tetramethyldiaminobenzophenone, p,p'-tetraethylethyl-aminobenzophenone, 2-chlorothioxanthone, anthrone, 9-ethoxyanthracene, anthracene, pyrene, perylene, phenothiazine, benzyl, acridine orange, benzoflavin, cetoflavin-T, 9,10-diphenylanthracene, 9-fluorenone, acetophenone, phenathrene, 2-nitrofluorene, 5-nitroacenaphthene, benzoquinone, 2-chloro-4-nitroaniline, N-acetyl-p-nitroaniline, p-nitroaniline, N-acetyl-4-nitro-l-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonyl-coumarin), coronene, etc.

Also, these spectral sensitizers can be also used as light absorbers of a far ultraviolet light of a light source. In this case, the light absorber reduces the reflected light from a substrate to reduce the influence of multiple reflections in the resist film, whereby an effect of improving the standard wave is obtained.

The composition of the invention is dissolved in a solvent capable of dissolving the above-described components and coated on a support.

As the solvent (d) used in this case, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionte, methyl pyruvate, ethyl pyruvate, propyl pyruvate, N,N-dimethylformamide, dimethyl sulfoxide, N-methylpyrrolidone, tetrahydrofuran, etc., are preferred. These solvents are used singly or as a mixture of two or more kinds of them.

It is preferred to add a surface active agent to the above-described solvent. Practical examples of the solvent which can be used in the invention include nonionic surface active agents, for example, polyoxyethylene alkyl ethers such as polyoxyethylene lauryl ether, polyoxyethylene stearyl ether, polyoxyethylene cetyl ether, polyoxyethylene oleyl ether, etc.; polyoxyethylene alkylallyl ethers such as polyoxyethylene octylphenol ether, polyoxyethylene non-ylphenol ether, etc.; polyoxyethylene.polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate, etc.; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine-base surface active agents such as Eftop EF301, EF303, and EF352 (manufactured by Shin Akita Kasei K.K.), Megafac F171, F173, F176, F189, R08 (manufactured by DAINIPPON INK & CHEMICALS, INC.), Asahi Guard AG 710, Surflon S-382, SC 101, SC 102, SC 103, SC 104, SC 105, and SC 106 (manufactured by Asahi Glass Company, Ltd.); organosiloxane polymer KP 341 (manufactured by Shin-Etsu Chemical Co., Ltd.); acrylic acid-base or methacrylic acid-base (co)polymer, Polyflow No. 75 and No. 95 (manufactured by Kyoeisha Yusi Kagaku Kogyo K.K.); Troysol S-366 (manufactured by Troy Chemical Co., Ltd.), etc.

The compounding amount of the surface active agent is usually not more than 2 parts by weight, and preferably not more than 1 part by weight per 100 parts by weight of the solid components in the composition of the invention.

In these surface active agents, the fluorine atom- and/or silicon atom-containing surface active agents are preferred.

These surface active agents may be used singly or as a combination of two or more kinds thereof.

After coating the above-described positive-working radiation-sensitive composition of the invention on a substrate (for example, silicon/silicon dioxide coating) as used for the production of a precise integrated circuit device by a proper coating method such as a spinner, a coater, etc., the coated layer is light-exposed through a definite mask, and by applying baking and development, a good resist pattern can be obtained.

As the developer for the radiation-sensitive composition of the invention, an alkaline aqueous solution of inorganic alkalis such as sodium hydroxide, potassium hydroxide, sodium carbonate, sodium silicate, sodium metasilicate, aqueous ammonia, etc.; primary amines such as ethylamine, n-propylamine, etc.; secondary amines such as diethylamine, di-n-butylamine, etc.; tertiary amines such as triethylamine, methyldiethylamine, etc.; alcoholamines such as dimethylethanolamine, triethanolamine, etc.; quaternary ammonium salts such as tetramethylammonium hydroxide, tetraethylammonium hydroxide, etc.; cyclic amines such as pyrrole, piperidine, etc., can be used.

Furthermore, a proper amount of an alcohol or a surface active agent can be used to the above-described alkaline aqueous solution.

Then, the present invention is described in detail by the following examples but the invention is not limited to these examples.

Synthesis Examples of Resins

Synthesis of p-[1-(cyclohexylethoxy)ethoxy]-styrene/p-hydroxystyrene (30/70) (resin P 2):

In 320 g of propylene glycol monomethyl ether acetate (PGMEA) was dissolved by heating 70 g of p-hydroxystyrene (VP-8000, manufactured by Nippon Soda Co., Ltd.), and after dehydrating by vacuum distillation the solution was cooled to 20° C. To the solution were added 0.35 g of pyridinium-p-toluenesulfonate and 22.4 g of cyclohexane ethanol. Then, after slowly adding 17.5 g of tert-butyl vinyl ether to the solution, the reaction was carried out at 20° C. for 5 hours. To the reaction liquid were added 0.28 g of triethylamine and 320 ml of ethyl acetate and the mixture was washed three times with 150 ml of distilled water. The solvent was distilled off and the residue was concentrated. The oil obtained was dissolved in 100 ml of acetone and 2 liters of distilled water was slowly added to the solution. A powder deposited was collected by filtration and dried to obtained 54 g of the desired product.

Synthesis of [p-[1-(cyclohexylethoxy)ethoxy]-styrene/p-acetoxystyrene/p-hydroxystyrene (30/10/60) (resin P 3):

In 320 g of propylene glycol monomethyl ether acetate (PGMEA) was dissolved by heating 70 g of p-hydroxystyrene (VP-8000, manufactured by Nippon Soda Co., Ltd.), and after dehydrating by vacuum distillation, the solution was cooled to 20° C. To the solution were added 0.35 g of pyridinium-p-toluenesulfonate and 22.4 g of cyclohexane ethanol. After slowly adding 17.5 g of tert-butyl vinyl ether to the solution, the reaction was carried out at 20° C. for 5 hours. To the reaction liquid was added 5.53 g of pyridine and to the mixture was slowly added 5.9 g of acetic anhydride. Then, the reaction was carried out at room temperature for one hour, and after adding 320 ml of ethyl acetate to the reaction liquid, the mixture was washed three times with 150 ml of distilled water. Then, the solvent was distilled off and the residue was concentrated. A powder deposited was collected by filtration and dried to obtained 58 g of the desired product.

Other resins were also synthesized by the same way as described above.

Synthesis of Photo-acid Generator (b-1)
Synthesis of the Compound (PAG-A1)

In 800 ml of benzene was dissolved 50 g of diphenyl sulfoxide and after adding thereto 200 g of aluminum chloride, the mixture was refluxed for 24 hours. The reaction liquid was slowly poured to 2 liters of ice and after adding thereto 400 ml of concentrated hydrochloric acid, the mixture was heated to 70° C. for 10 minutes. The aqueous solution was washed with 500 ml of ethyl acetate, and after filtering, a solution of 200 g of ammonium iodide dissolved in 400 ml of water was added. A powder thus deposited was collected by filtration and after washing with water, was washed with ethyl acetate and dried to obtain 70 g of triphenylsulfonium iodide. After dissolving 50 g of triphenylsulfonium iodide in 300 ml of methanol, 31 g of silver oxide was added to the solution followed by stirring for 4 hours After filtering the reaction liquid, 45 g of 2,4,6-tri-isopropylbenzenesulfonic acid tetramethylammonium salt (obtained by reacting 2,4, 6-tri-isopropylbenzenesulfonyl chloride and tetramethylammonium hydroxide in water and methanol by heating). The solution was concentrated, a powder obtained was sufficiently washed with water, and recrystallized from ethyl acetate/acetone to obtain 50 g of the compound (PAG-A1).

Synthesis of the Compound (PAG-A2)

In 200 ml of ion-exchanged water was dissolved 19.9 g (0.030 mol) of an aqueous solution of a mixture of triarylsulfonium Cl salt (aqueous solution of 50% triphenylsulfonium chloride, manufactured by Fluka Co.), triphenylsulfonium, 4,4'-bis(diphenylsufonio) diphenylsufide, etc. To the solution wad added a solution of 10.5 g (0.030 mol) of the Na salt of a hard-type (branched type) dodecylbenzenesulfonic acid of the structure described below dissolved in 400 ml of ion-exchanged water with stirring at room temperature.

A viscous solid deposited was separated by decantation and washed with one liter of ion-exchanged water.

The viscous solid deposited was dissolved in 100 ml of acetone, and added to 500 ml of ion-exchanged water to be recrystallized. The deposits thus obtained were dried in vacuo at 50° C., whereby 15.5 g of glassy solids were obtained. It was confirmed by an NMR measurement that the solid was the desired photo-acid generator (PAG-A2).

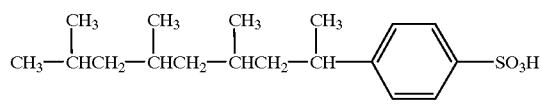

Synthesis of Photo-acid Generator (b-2)
Synthesis of bis(tert-amylphenyliodonium)p-tolyl acetate (I-1)

In 2 liters of methanol was dissolved 91 g of bis(tert-amylphenyliodonium)iodide and after adding thereto 40 g of silver oxide (I), the mixture was stirred for 4 hours at room temperature. After filtering the reaction liquid to remove a silver compound, 30 g of p-tolylacetic acid was added to the filtrate. The solution was concentrated and the oily product obtained was dissolved in 2 liters of ethyl acetate. The solution was washed two times with 500 ml of an aqueous solution of 2.38% tetramethylammonium hydroxide and washed three times with 500 ml of distilled water. The solution was concentrated and solids obtained were washed with 500 ml of di-isopropyl ether to obtain 63 g of the desired product.

Synthesis of bis(tert-amylphenyliodonium)acetate (I-9)

In 2 liters of methanol was dissolved 50 g of bis(tert-amylphenyliodonium)iodide and after adding thereto 22 g of silver oxide (I), the mixture was stirred for 4 hours at room temperature. After filtering the reaction liquid to remove a silver compound, 7.5 g of acetic acid was added to the filtrate. The solution was concentrated and solids obtained were washed with 300 ml of isopropyl ether to obtain 32 g of the desired product.

Synthesis of bis(tert-amylphenyliodonium)p-nitrobenzoate (I-2)

In 700 ml of methanol was dissolved 10 g of bis (tert-amylphenyliodonium) iodide, and after adding thereto 4.44 g of silver oxide (I), the mixture was stirred for 4 hours at room temperature. After filtering the reaction liquid to remove a silver compound, 4.0 g of p-nitrobenzoic acid was added to the filtrate. The solution was concentrated and when the solids obtained were washed two times with 500 ml of an aqueous solution of 2.38% tetraethylammonium hydroxide and then three times with 500 ml of distilled water followed by drying, 4.2 g of the desired product was obtained.

Synthesis of Triphenylsulfonium p-tolylacetate (II-1)

To 500 ml of methanol was dissolved 8.2 g of triphenylsulfonium and after adding thereto 5.1 g of silver oxide (I), the mixture was stirred for 4 hours at room temperature. After filtering the reaction liquid to remove a silver compound, 3.8 g of p-tolylacetic acid was added to the filtrate. The solution was concentrated and when the oily product obtained was washed three times with 200 ml of ethyl acetate to obtain 5.1 g of the desired product.

Synthesis of Triphenylsulfonium Acetate (II-5)

To 500 ml of methanol was dissolved 20 g of triphenylsulfonium iodide and after adding thereto 12.5 of silver oxide (I), the mixture was stirred for 4 hours at room temperature. After filtering the reaction liquid to remove a silver compound, 4.0 g of acetic acid was added to the filtrate. The solution was concentrated and when the oily product obtained was washed two times with 300 ml of di-isopropyl ether to obtain 11.2 g of the desired product.

EXAMPLES 1 TO 20 AND COMPARATIVE EXAMPLES 1 TO 3

Preparation and Evaluation of Composition

The components shown in Table 1 below were dissolved in 8 g of a solvent, PGMEA (propylene glycol monomethyl ether acetate) and by filtrating with a filter of 0. 1 μm, each resist solution was prepared. The resist solution was coated on a silicon wafer using a spin coater and dried by a vacuum adsorption type hot plate at 130° C. for 60 seconds to obtain a resist film having a thickness of 0.4 μm.

TABLE 1

| Resin No. (g) | Photo-acid-generator (g) | Organic basic compound (g) | Surface active agent (ppm) |
|---|---|---|---|
| C. Ex 1 P1 (0.16) | PAG-A1 (0.08) | E-1 (0.0015) | R08 (100) |
| C. Ex 2 P1 (0.16) | PAG-A1 (0.04), I-1 (0.04) | E-1 (0.0015) | R08 (100) |
| C. Ex 3 P2 (0.16) | PAG-A1 (0.08) | E-1 (0.0015) | R08 (100) |
| Ex. 1 P2 (0.16) | PAG-A1 (0.04), I-1 (0.04) | E-1 (0.0015) | R08 (100) |
| Ex. 2 P2 (0.16) | PAG-A1 (0.04), I-8 (0.04) | E-1 (0.0015) | R08 (100) |
| Ex. 3 P2 (0.16) | PAG-A2 (0.04), I-1 (0.04) | E-1 (0.0015) | R08 (100) |
| Ex. 4 P2 (0.16) | PAG-A2 (0.04), I-2 (0.04) | E-1 (0.0015) | R08 (100) |
| Ex. 5 P2 (0.16) | PAG-A2 (0.04), I-10 (0.04) | E-1 (0.0015) | R08 (100) |
| Ex. 6 P3 (0.16) | PAG-A2 (0.04), I-11 (0.04) | E-1 (0.0015) | R08 (100) |
| Ex. 7 P3 (0.16) | PAG-A2 (0.04), II-1 (0.04) | E-1 (0.0015) | W-1 (100) |
| Ex. 8 P3 (0.16) | PAG-A2 (0.04), II-2 (0.04) | E-1 (0.0015) | W-1 (100) |
| Ex. 9 P3 (0.16) | PAG-A2 (0.04), II-8 (0.04) | E-2 (0.0015) | W-1 (100) |
| Ex. 10 P3 (0.16) | PAG-A2 (0.04), II-6 (0.04) | E-3 (0.0015) | W-1 (100) |
| Ex. 11 P4 (0.16) | PAG-A2 (0.04) II-14 (0.04) | E-1 (0.0015) | W-1 (100) |
| Ex. 12 P4 (0.16) | PAG-A2 (0.04), II-5 (0.04) | E-1 (0.0015) | W-1 (100) |
| Ex. 13 P4 (0.16) | PAG-A2 (0.04), I-9 (0.04) | E-1 (0.0015) | W-1 (100) |
| Ex. 14 P5 (0.16) | PAG-A2 (0.04), I-2 (0.04) | E-1 (0.0015) | W-1 (100) |
| Ex. 15 P6 (0.16) | PAG-A2 (0.04), I-2 (0.04) | E-1 (0.0015) | W-1 (100) |
| Ex. 16 P2 (0.16) | PAG-A3 (0.04), I-1 (0.04) | E-1 (0.0015) | R08 (100) |
| Ex. 17 P3 (0.16) | PAG-A3 (0.02) PAG-A1 (0.02), I-8 (0.03) | E-1 (0.0015) | R08 (100) |
| Ex. 18 P4 (0.08) P5 (0.08) | PAG-A3 (0.01) PAG-A2 (0.03), II-1 (0.04) | E-1 (0.0015) | W-1 (100) |
| Ex. 19 P6 (0.16) | PAG-A3 (0.03) PAG-A1 (0.01) PAG-A2 (0.01), I-11 (0.03) | E-2 (0.0015) | W-1 (100) |
| Ex. 20 P2 (0.08) P3 (0.04) P4 (0.04) | PAG-A3 (0.03) PAG-A2 (0.01), I-11 (0.03) II-1 (0.01) | E-3 (0.0015) | W-1 (100) |

C. Ex: Comparative Example
Ex.: Example

The compounds shown in Table 1 are as follows.
Resins
P1: p-[1-(Ethoxy)]ethoxy]styrene/p-hydroxystyrene (35/65)
P2: p-[1-(Cyclohexylethoxy)ethoxy]styrene/p-hydroxystyrene (30/70)
P3: p-[1-(Cyclohexylethoxy)ethoxy]styrene/p-acetoxystyrene/p-hydroxystyrene (30/10/60)
P4: p-[1-(Cyclohexylethoxy)ethoxy]styrene/p-tert-butylstyrene/p-hydroxystyrene (30/10/60)
P5: p-[1-(Benzyloxy)ethoxy]styrene/p-hydroxystyrene (30/70)
P6: p-[1-(Phenetyloxyethoxy)ethoxy]styrene/p-acetoxystyrene/p-hydroxystyrene (30/10/60)

In each of the above-described resins, the weight average molecular weight (the polystyrene converted value confirmed by the GPC method) of polyhydroxystyrene before adding a protective group, etc., is 8000 in P1 to P3, 15,000 in P4 and P5, and 20,000 in P6.
Photo-acid Generator
PAG-A3: The above-described compound PAG 7-3 (manufactured by Midori Kagaku K.K.)
Surface active agents
ROB: Megafac R08
W-1: Troysol S-366

Organic Basic Compounds

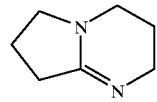
(E-1)

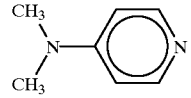
(E-2)

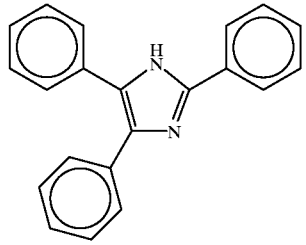
(E-3)

Each resist film was exposed using a KrF excimer laser stepper (NA=0.63) of a wavelength of 248 nm. After exposure, the resist film was heated by a hot plate of 100° C. for 60 seconds, immediately dipped in an aqueous solution of 0.26 N tetramethylammonium hydroxide (TMAH) for 60 seconds, rinsed with water for 30 seconds and dried. The pattern on the silicon wafer thus formed was observed by a CD-measurement scanning type electron microscope (CD-SEM) and the resist performance (pitch dependency and exposure latitude) shown in the table was obtained. (Table 2 below)

The pitch (iso/dense) difference $\Delta CD$ shows the dimensional difference from 0.17 $\mu$m in the case of measuring the formation dimension of the pattern of L/S=1:5 by the same dimension in the exposure amount of reproducing the pattern of L/S=1:1.5 with the mask dimension of 0.17 $\mu$m.

About the exposure latitude $\Delta exp$, by firstly determining the optimum exposure amount of reproducing the pattern of L/S=1:1 by the mask dimension of 0.15 $\mu$m, and secondary determining the range of the exposure amount that the dimension formed after development becomes the range of 150 nm±10%, the $\Delta exp$ shows the value of dividing the exposure amount range by the optimum exposure amount.

TABLE 2

| | Iso/Dense difference $\Delta CD$ | Exposure latitude $\Delta exp$ |
|---|---|---|
| Comp. Example 1 | 30.8 nm | 8.2% |
| Comp. Example 2 | 25.2 nm | 8.5% |
| Comp. Example 3 | 30.0 nm | 9.0% |
| Example 1 | 15.1 nm | 13.5% |
| Example 2 | 14.3 nm | 13.6% |
| Example 3 | 13.8 nm | 11.8% |
| Example 4 | 15.5 nm | 11.5% |
| Example 5 | 13.8 nm | 13.5% |
| Example 6 | 14.5 nm | 14.1% |
| Example 7 | 15.6 nm | 12.8% |
| Example 8 | 16.3 nm | 14.3% |
| Example 9 | 13.7 nm | 13.8% |
| Example 10 | 13.9 nm | 12.7% |
| Example 11 | 14.1 nm | 14.3% |
| Example 12 | 14.5 nm | 13.3% |
| Example 13 | 15.8 nm | 13.7% |

TABLE 2-continued

| | Iso/Dense difference ΔCD | Exposure latitude Δexp |
|---|---|---|
| Example 14 | 19.5 nm | 10.8% |
| Example 15 | 18.3 nm | 11.2% |
| Example 16 | 14.8 nm | 13.1% |
| Example 17 | 15.5 nm | 11.6% |
| Example 18 | 13.9 nm | 14.2% |
| Example 19 | 14.6 nm | 13.3% |
| Example 20 | 16.5 nm | 12.6% |

Comp. Example: Comparative Example

As shown in Table 2, the compositions of the invention are excellent in the pitch dependency and show a large exposure latitude.

As described above in detail, the positive-working radiation-sensitive composition of the invention is excellent in the pitch dependency and the exposure latitude.

While the invention has been described in detail and with reference to specific embodiments thereof, it will be apparent to one skilled in the art that various changes and modifications can be made therein without departing from the spirit and scope thereof.

This application is based on Japanese patent applications No. Hei-11-370355 filed on Dec. 27, 1999 and No. 2000-318057 filed on Oct. 18, 2000, the entire contents of which incorporated herein by reference.

What is claimed is:

1. A positive-working radiation-sensitive composition comprising
   (a) a resin having an acid-decomposing group represented by the following formula (I'), which is decomposed by the action of an acid to increase the solubility in an alkali developer,
   (b-1) at least one compound which generates an acid by the irradiation of an active light or radiation and contributes to the decomposition reaction of the above-described acid-decomposing group,
   (b-2) at least one compounds which generates an acid by the irradiation of an active light or radiation but does not contribute to the decomposition reaction of the above-described acid-decomposing group,
   (c) a surface active agent, and
   (d) a solvent;

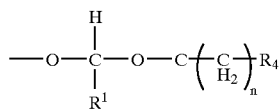
(I')

wherein $R_1$ represents an alkyl group having from 1 to 4 carbon atoms, $R_4$ represents a substituted or unsubstituted aryl group or a substituted or unsubstituted cyclic alkyl group having from 3 to 15 carbon atoms; n represents a natural number of from 1 to 4.

2. The positive-working radiation-sensitive composition according to claim 1, wherein said resin (a) comprises repeating units, each containing a hydroxystyrene group, wherein at least a part of the hydroxy groups of the hydroxystyrene groups of the repeating units are protected by said acid-decomposing group of formula (I').

3. The positive-working radiation-sensitive composition according to claim 2, wherein from 5 to 45 mol % of the hydroxy groups of the hydroxystyrene groups of the repeating units of the resin (a) are protected by said acid-decomposing group of formula (I').

4. The positive-working radiation-sensitive composition according to claim 2, wherein from 10 to 30 mol % of the hydroxy groups of the hydroxystyrene groups of the repeating units of the resin (a) are protected by said acid-decomposing group of formula (I').

5. The positive-working radiation-sensitive composition according to claim 1, wherein the compound (b-1) is a compound generating a sulfonic acid by the irradiation of an active light or radiation and the compound (b-2) is a compound generating a carboxylic acid by the irradiation of an active light or radiation.

6. The positive-working radiation-sensitive composition according to claim 1, wherein the composition further contains an organic basic compound.

7. The positive-working radiation-sensitive composition according to claim 1, wherein the amount of the resin (a) is from 10 to 99.9% by weight based on the total weight excluding a solvent of the composition.

8. The positive-working radiation-sensitive composition according to claim 1, wherein the amount of the resin (a) is from 50 to 99.5% by weight based on the total weight excluding a solvent of the composition.

9. The positive-working radiation-sensitive composition according to claim 1, wherein the amount of the resin (a) is from 70 to 99.0% by weight based on the total weight of the composition excluding the solvent.

10. The positive-working radiation-sensitive composition according to claim 1, wherein the composition further contains an alkali-soluble resin which does not contain an acid-decomposing group.

11. The positive-working radiation-sensitive composition according to claim 1, wherein the amount of the component (b-1) is from 0.001 to 40% by weight based on the total weight of the composition excluding the solvent.

12. The positive-working radiation-sensitive composition according to claim 1, wherein the amount of the component (b-1) is from 0.01 to 20% by weight based on the total weight of the composition excluding the solvent.

13. The positive-working radiation-sensitive composition according to claim 1, wherein the amount of the component (b-1) is from 0.1 to 5% by weight based on the total weight of the composition excluding the solvent.

14. The positive-working radiation-sensitive composition according to claim 1, wherein the amount of the component (b-2) is from 0.01 to 20% by weight based on the total weight of the composition excluding the solvent.

15. The positive-working radiation-sensitive composition according to claim 1, wherein the amount of the component (b-2) is from 0.5 to 10% by weight based on the total weight of the composition excluding the solvent.

16. The positive-working radiation-sensitive composition according to claim 1, wherein the amount of the component (b-2) is from 1 to 7% by weight based on the total weight of the composition excluding the solvent.

17. The positive-working radiation-sensitive composition according to claim 1, wherein the weight ratio of the components (b-2)/(b-1) is from 0.01 to 5.

18. The positive-working radiation-sensitive composition according to claim 1, wherein the weight ratio of the components (b-2)/(b-1) is from 0.05 to 3.

19. The positive-working radiation-sensitive composition according to claim 1, wherein the weight ratio of the components (b-2)/(b-1) is from 0.1 to 2.

* * * * *